US012805038B2

(12) United States Patent
Chung et al.

(10) Patent No.: US 12,805,038 B2
(45) Date of Patent: Nov. 17, 2026

(54) ZIG-ZAG SIGNAL SHIELDING FOR PIXEL ARRAY

(71) Applicant: Taiwan Semiconductor Manufacturing Company, Ltd., Hsinchu (TW)

(72) Inventors: Chi-Hsien Chung, New Taipei City (TW); Tzu-Jui Wang, Fengshan City (TW); Chia-Chi Hsiao, Tianzhong Township (TW); Kuan-Chieh Huang, Hsinchu City (TW); Wei-Cheng Hsu, Kaohsiung City (TW); Hao-Lin Yang, Kaohsiung City (TW); Yi-Han Liao, Taichung City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 651 days.

(21) Appl. No.: 18/297,162

(22) Filed: Apr. 7, 2023

(65) Prior Publication Data

US 2024/0339467 A1 Oct. 10, 2024

(51) Int. Cl.

| | |
|---|---|
| ***H10F 39/00*** | (2025.01) |
| ***H10F 39/18*** | (2025.01) |
| ***H10P 10/00*** | (2026.01) |

(52) U.S. Cl.

CPC ....... *H10F 39/8027* (2025.01); *H10F 39/014* (2025.01); *H10F 39/18* (2025.01);

(Continued)

(58) Field of Classification Search

CPC .. H10F 39/014; H10F 39/802; H10F 39/8027; H10F 39/8037; H10F 39/807;

(Continued)

(56) References Cited

U.S. PATENT DOCUMENTS

| | | | | |
|---|---|---|---|---|
| 9,508,770 | B2 * | 11/2016 | Yanagita | H10F 39/018 |
| 2019/0096830 | A1 * | 3/2019 | Wei | H10F 39/018 |

(Continued)

FOREIGN PATENT DOCUMENTS

| | | | | |
|---|---|---|---|---|
| WO | WO-2020100806 A1 * | 5/2020 | | H10F 39/811 |
| WO | WO-2020175712 A2 * | 9/2020 | | H04N 25/63 |
| WO | WO-2023105935 A1 * | 6/2023 | | H10F 39/811 |

*Primary Examiner* — Matthew E Warren

(74) *Attorney, Agent, or Firm* — Eschweiler & Potashnik, LLC

(57) ABSTRACT

Some embodiments relate to an IC device, including a first chip comprising a plurality of pixel blocks respectively including one of a first plurality of conductive pads, the plurality of pixel blocks arranged in rows extending in a first direction and columns extending in a second direction perpendicular to the first direction; a second chip bonded to the first chip at a bonding interface, where the second chip comprises a second plurality of conductive pad recessed and contacting the first plurality of conductive pads along the bonding interface; and a first corrugated shield line having outermost edges set-back along the second direction from outermost edges of a first row of the plurality of pixel blocks, the first corrugated shield line being arranged within a first dielectric layer and laterally separating neighboring ones of the first plurality of conductive pads within the first row of the plurality of pixel blocks.

20 Claims, 17 Drawing Sheets

(52) U.S. Cl.
CPC ....... *H10F 39/8037* (2025.01); *H10F 39/807* (2025.01); *H10F 39/811* (2025.01); *H10P 10/12* (2026.01); *H10P 10/128* (2026.01)

(58) Field of Classification Search
CPC ........ H10F 39/809; H10F 39/18; H10P 10/00; H10P 10/12; H10P 10/128
See application file for complete search history.

(56) References Cited

U.S. PATENT DOCUMENTS

| | | | | |
|---|---|---|---|---|
| 2020/0286943 | A1 | 9/2020 | Tange et al. | |
| 2021/0280545 | A1 | 9/2021 | Watanabe | |
| 2021/0305303 | A1* | 9/2021 | Onuki | H10F 39/809 |
| 2021/0391376 | A1 | 12/2021 | Chen et al. | |
| 2022/0102397 | A1 | 3/2022 | Wu et al. | |
| 2022/0199670 | A1 | 6/2022 | Jang et al. | |
| 2022/0367391 | A1* | 11/2022 | Wei | H10F 39/018 |
| 2024/0250104 | A1* | 7/2024 | Park | H10F 39/809 |
| 2024/0347576 | A1* | 10/2024 | Yang | H10F 39/18 |
| 2024/0355859 | A1* | 10/2024 | Yang | H10F 39/018 |
| 2025/0228029 | A1* | 7/2025 | Fujii | H10F 39/809 |

* cited by examiner

ZIG-ZAG SIGNAL SHIELDING FOR PIXEL ARRAY

BACKGROUND

Many modern-day electronic devices contain digital image sensors. Digital image sensors may be backside illumination sensors or frontside illumination sensors. Digital image sensors may utilize multi-chip packaging to lower the area per pixel and increase the resolution of the resulting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
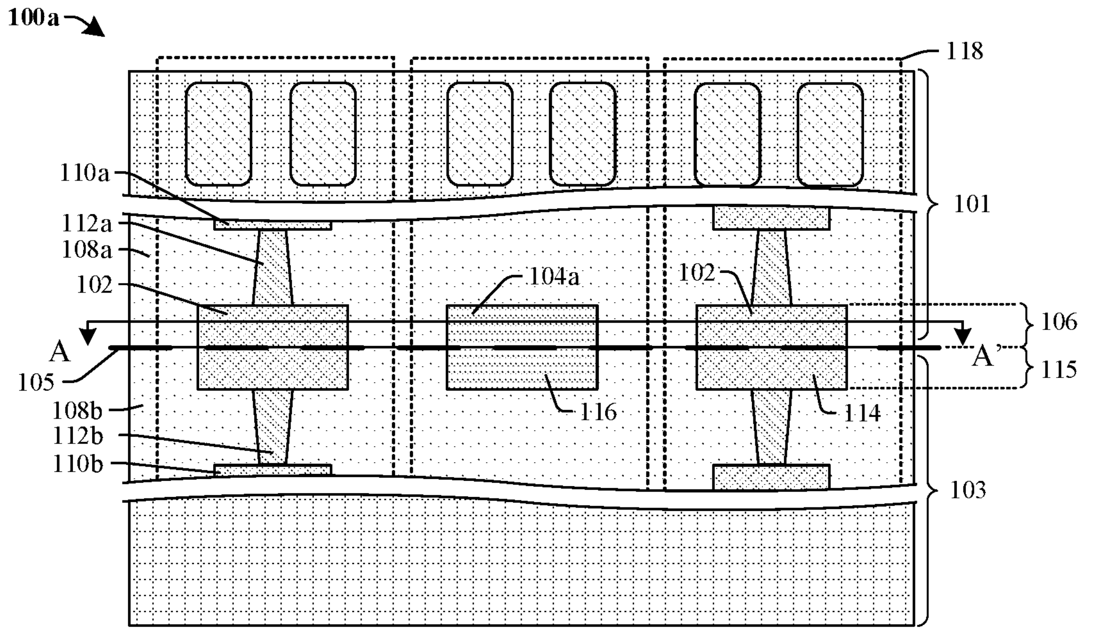
FIGS. 1A and 1B illustrate a cross-sectional view and a top layout view of some embodiments of an integrated circuit (IC) device comprising a metal-metal (M-M) and dielectric-dielectric (D-D) bonding layer with corrugated shield lines.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a pixel array having a plurality of pixels arranged in rows and columns. The pixels comprise individual photodetectors in a substrate of a first IC chip. The pixels further comprise individual transfer transistors coupling the individual photodetectors to individual floating diffusion nodes in the substrate. The floating diffusion nodes may be electrically coupled to an interconnect structure of a second IC chip through a metal-metal (M-M) and dielectric-dielectric (D-D) bonding layer. The M-M and D-D bonding layer comprises a plurality of conductive pads surrounded by a dielectric material.

The second IC chip accommodates a plurality of transistors individual to the pixels. These transistors include a plurality of source-follower transistors, a plurality of reset transistors, and a plurality of selection transistors which are configured to read the photodetectors and selectively pass the readings of the photodetectors to an application specific integrated circuit (ASIC) on a third IC chip. Arranging the transistors at the second IC chip, rather than at the first IC chip, frees space on the first IC chip to allow shrinking of the pixels without reducing the size of the photodetectors. This, in turn, increases a maximum resolution of the image sensor. A higher maximum resolution is desirable as it increases a quality of an acquired image.

During operation of the image sensor, charges are transferred from the individual photodetectors to gates of the plurality of source-follower transistors through the conductive pads within the M-M and D-D bonding layer. Due to a proximity of the conductive pads with respect to one another, there may be a mutual inductance and mutual capacitance between the conductive pads. The mutual inductance and capacitance between the conductive pads results in cross-talk between the conductive pads. The resulting cross-talk increases as the image sensor is scaled down and reduces an accuracy of a captured image. The cross-talk can be avoided by completely surrounding the conductive pads with electrically grounded shield lines. However, completely surrounding each conductive pad with a shield line increases a pattern density of the M-M and D-D bonding layer, leading to a higher rate of patterning failure, increased dishing, and a lower bond interface quality between the first IC chip and the second IC chip.

The present disclosure relates to an image sensor integrated chip (IC) comprising a plurality of pixel blocks arranged in an array in rows and columns. A plurality of conductive pads are arranged within the plurality of pixel blocks. A corrugated shield line extends between conductive pads within a row of pixel blocks, but does not extend between the conductive pads in the row and additional conductive pads in different rows of pixel blocks. The corrugated shield line is configured to interrupt electromagnetic fields and reduce the mutual inductance and capacitance between neighboring ones of the conductive pads in the row of pixel blocks. The reduction in mutual inductance reduces an amount of interference, resulting in the image sensor IC producing a higher quality image. Because the pixel blocks may be read on a row-by-row basis, the lack of a shielding line between the conductive pads and the additional conductive pads will not significantly impact cross-talk between different rows of pixel blocks. However, not putting shield lines between the conductive pads and the additional conductive pads results in a reduced pattern density of the M-M and D-D bonding layer, thereby reducing an amount of patterning failures and enhancing a bond interface quality between a first IC chip and a second IC chip.

Figure 1B:
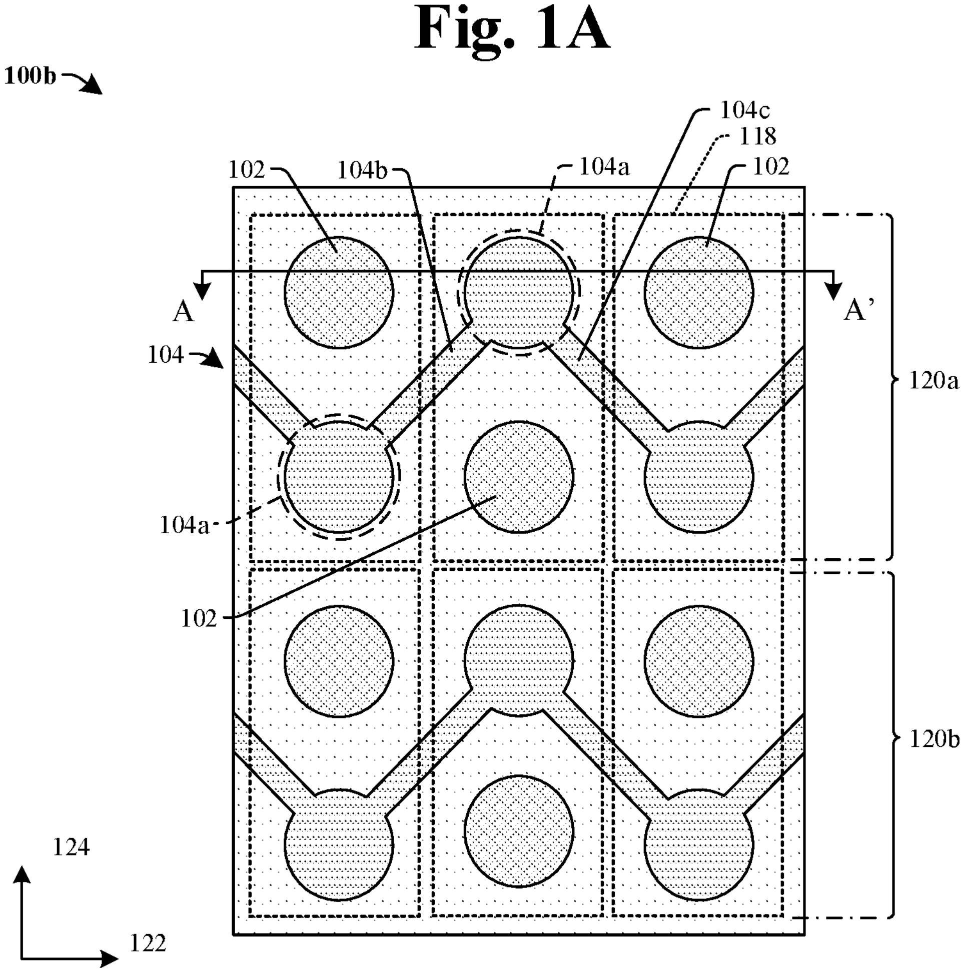

FIGS. 1A and 1B respectively illustrate a cross-sectional view 100*a* and a top layout view 100*b* of some embodiments of an integrated circuit (IC) device comprising an M-M and D-D bonding layer with corrugated shield lines. The cross-sectional view 100*a* of FIG. 1A may, for example, be taken along line A-A' in FIG. 1B, and/or the top layout view 100*b* of FIG. 1B may, for example, be taken along line A-A' in FIG. 1A.

As shown cross-sectional view 100*a*, the IC device comprises a first IC chip 101 with a first M-M and D-D bonding layer 106 and a second IC chip 103 with a second M-M and D-D bonding layer 115. The first M-M and D-D bonding layer 106 comprises a first plurality of conductive pads 102 that are electrically coupled to a first wire level 110*a* by a first plurality of bond contacts 112*a*. The second M-M and D-D bonding layer 115 comprises a second plurality of conductive pads 114 that are electrically coupled to a second wire level 110*b* by a second plurality of bond contacts 112*b*. Further, the first plurality of conductive pads 102 are electrically coupled to the second wire level 110*b* by the second plurality of bond contacts 112*b* and the second plurality of conductive pads 114 in the second M-M and D-D bonding layer 115.

The first plurality of conductive pads 102 are surrounded by a first dielectric layer 108*a*, and the second plurality of conductive pads 114 are surrounded by the second dielectric layer 108*b*. The first and second dielectric layers 108*a*, 108*b* are bonded to each other at a first bond interface 105. In some embodiments, the second plurality of conductive pads 114 are in the second IC chip 103 and are bonded to the first plurality of conductive pads 102 at the first bond interface 105. As such, the first bond interface 105 has a dielectric-to-dielectric bond interface and a metal-to-metal bond interface and is hence a hybrid or mix of the two bond interfaces. The symmetrical bonding of the first plurality of conductive pads 102 to the second plurality of conductive pads 114 results in a stronger bond between the first IC chip 101 and the second IC chip 103, as the first plurality of conductive pads 102 bond more effectively to the second plurality of conductive pads 114 than a second dielectric layer 108*b* of the second IC chip 103.

In some embodiments, the first plurality of bond contacts 112*a*, the second plurality of bond contacts 112*b*, the first plurality of conductive pads 102, the second plurality of conductive pads 114 or any combination of the foregoing are or comprise a metal such as copper (e.g., Cu), aluminum, silver (e.g., Ag), gold (e.g., Au), and/or the like. In some embodiments, the first and second dielectric layers 108*a*, 108*b* respectively comprise one or more separate dielectric materials. The first dielectric layer 108*a* is bonded to the second dielectric layer 108*b* through van der Waals forces. In some embodiments, the first dielectric layer 108*a* and the second dielectric layer 108*b* may be or comprise one of silicon oxide (e.g., $SiO_2$), silicon nitride (e.g., $Si_3N_4$), silicon oxynitride, and/or the like.

As shown in cross-sectional view 100*a* and top layout view 100*b*, the integrated chip comprises a plurality of pixel blocks 118 respectively comprising one or more photodetectors. For example, a pixel block of the plurality of pixel blocks 118 may comprise 4 photodetectors (e.g., arranged in a 2×2 array), 8 photodetectors (e.g., arranged in a 2×4 array), or other similar values. The plurality of pixel blocks 118 are arranged in rows extending in a first direction 122 and columns extending in a second direction 124 perpendicular to the first direction 122. The plurality of pixel blocks 118 respectively comprise one of the first plurality of conductive pads 102. During a read operation, the first plurality of conductive pads 102 transfer charges from individual photodetectors within the plurality of pixel blocks 118 to gates of source-follower transistors (e.g., within second IC chip 103) on a row-by-row basis. For example, during a read operation signals may be transferred from pixel blocks within a first row 120*a* while pixel blocks in a second row 120*b* are set to a high voltage (e.g., $V_{DD}$), and then signals may be subsequently transferred from pixel blocks within the second row 120*b* while pixel blocks in the first row 120*a* are set to a high voltage. Because the read operation is performed on a row-by-row basis, minimal noise is generated between conductive pads in neighboring rows (e.g., between conductive pads in the first row 120*a* and the second row 120*b*) during the read operation.

A first corrugated shield line 104 extends in a zig-zag pattern that laterally separates neighboring ones of the first plurality of conductive pads 102 within the row of the plurality of pixel blocks 118. For example, a first conductive pad within the first row 120*a* is laterally spaced from the second conductive pad within the first row 120*a* by the first corrugated shield line 104. The first corrugated shield line 104 has outermost surfaces that weave around neighboring ones of the first plurality of conductive pads 102 within the row. Outermost edges of the first corrugated shield line 104 are located at a top and a bottom of the zig-zag pattern, as viewed in top layout view 100*b*. In some embodiments, an entirety of the first corrugated shield line 104 is within a corresponding row of the plurality of pixel blocks 118. For example, the first corrugated shield line 104 may have outermost edges (e.g., topmost and bottommost edges as viewed in top layout view 100*b*) that are set-back from outermost edges (e.g., topmost and bottommost edges as viewed in top layout view 100*b*) of the first row 120*a* by non-zero distances. In some embodiments, an entirety of the first corrugated shield line 104 within a row is confined between opposing outermost edges (e.g., between top and bottom edges as viewed in top layout view 100*b*) of a plurality of conductive pads within the row. In some embodiments, a first corrugated shield line 104 within a row is outside of a neighboring row (e.g., does not extend from within the row to within the neighboring row). In some embodiments, the first corrugated shield line 104 is or comprises a metal such as copper (e.g., Cu), silver (e.g., Ag), gold (e.g., Au), aluminum and/or the like.

In some embodiments, the first corrugated shield line 104 may comprise shield line segments 104*b*-104*c* and one or more shield nodes 104*a* having a greater width than the shield line segments 104*b*-104*c*. In some embodiments, the one or more shield nodes 104*a* may have a same top geometry (e.g., a square shaped geometry) as a top geometry of the first plurality of conductive pads 102. In some such embodiments, the first plurality of conductive pads 102 are interleaved with shield nodes 104*a* in an array, such that placement of first plurality of conductive pads 102 and the shield nodes 104*a* alternate over both rows and columns. The first plurality of conductive pads 102 have a zig-zag layout along rows and columns. Additionally, a plurality of shield line segments 104*b*-104*c* extend in a zig-zag layout along rows and columns, and between neighboring shield nodes 104*a*. In some embodiments, a second corrugated shield line 116 is in the second IC chip 103 and is bonded to the first corrugated shield line 104 over a length of the first corrugated shield line 104. Further, a shield node of the second corrugated shield line 116 is directly between a first and a second one of the second plurality of conductive pads 114. In some embodiments, the second corrugated shield line 116 may comprise shield line segments and one or more shield nodes having a greater width than the shield line segments.

The first corrugated shield line 104 is biased in a manner that is configured to mitigate cross-talk between neighboring ones of the first plurality of conductive pads 102 within a row (e.g., first row 120*a* or second row 120*b*) of the plurality of pixel blocks 118. In some embodiments, to avoid coupling between neighboring conductive pads the first corrugated shield line 104 may be electrically grounded, electrically biased, or electrically floating. Because the first plurality of conductive pads 102 within a row are laterally separated by the first corrugated shield line 104, mutual inductance and capacitance between the first plurality of conductive pads within the row are reduced. This results in charges transferred through a first one of the first plurality of conductive pads having a diminished effect on other ones of the first plurality of conductive pads and vice versa. As a result, interference caused by a proximity of the first plurality of conductive pads to one another is reduced, and a pixel array split amongst the first IC chip 101 and the second IC chip 103 may output a higher quality image than would otherwise be possible. Furthermore, because the plurality of pixel blocks 118 are read on a row-by-row basis, a corrugated shield line is not needed between neighboring rows to provide noise mitigation, and thus can be avoided thereby limiting M-M and D-D bonding layer pattern density and resulting in a high-quality bonding interface.

Figure 2A:
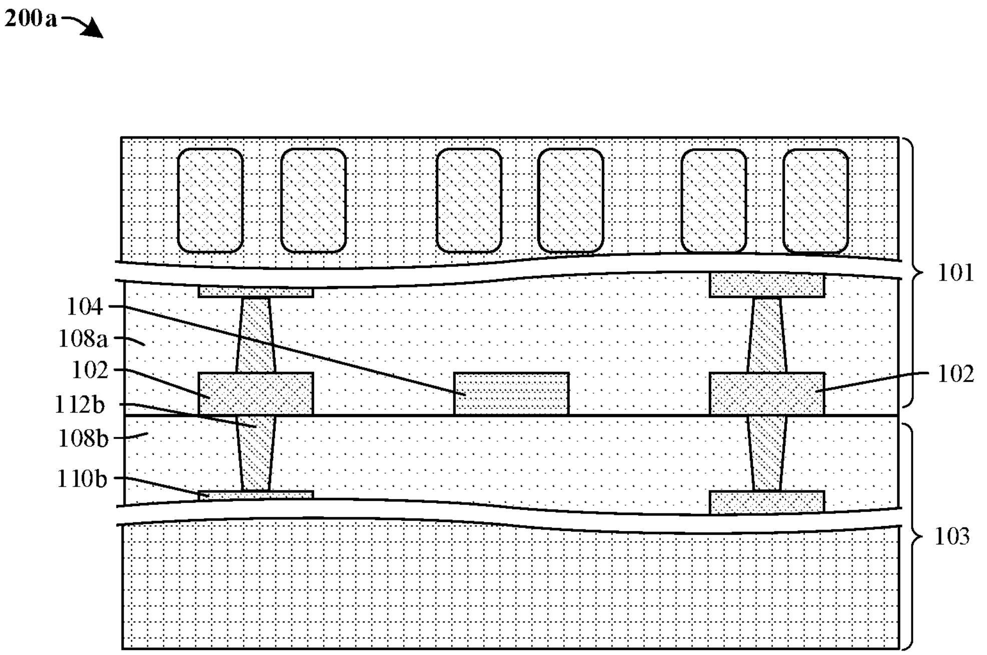
FIGS. 2A and 2B illustrate cross-sectional views of alternative embodiments of the IC device comprising an M-M and D-D bonding layer with corrugated shield lines.
Figure 2B:
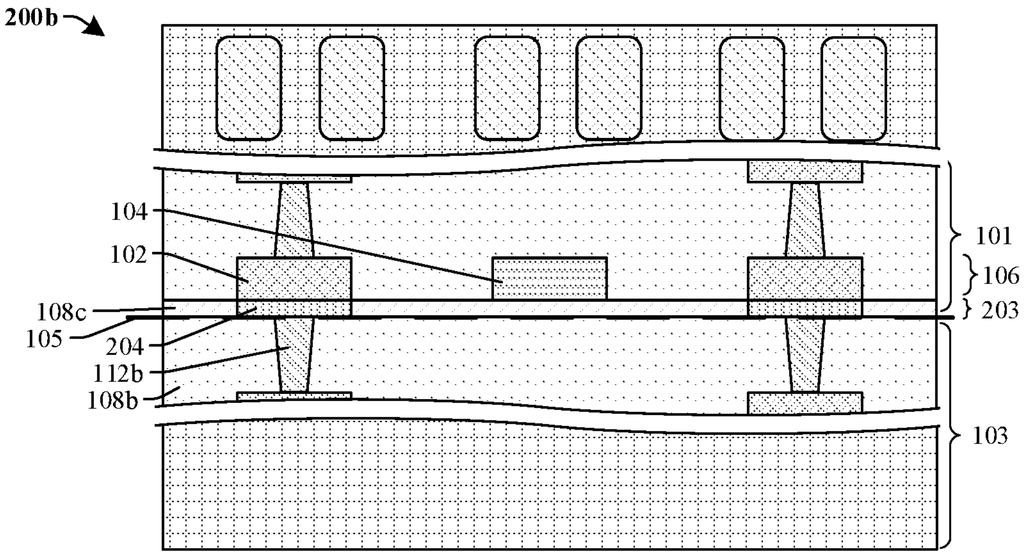

FIGS. 2A and 2B illustrate cross-sectional views of alternative embodiments of the IC device comprising an M-M and D-D bonding layer with corrugated shield lines.

As shown in the cross-sectional view 200*a* of FIG. 2A, in some embodiments, the second corrugated shield line (116 of FIG. 1A) and the second plurality of conductive pads (114 of FIG. 1A) are omitted from the second IC chip 103. The second plurality of bond contacts 112*b* are bonded to a first plurality of conductive pads 102 along the first bond interface 105, such that the bond interface is asymmetrical. The omission of the second corrugated shield line 116 and the second plurality of conductive pads 114 may be desirable to lower the cost of production, lower the combined size of the conductive pads, and lower the amount of mutual capacitance between adjacent conductive features.

During the bonding process, bubbles of gas may be trapped between the first dielectric layer 108*a* and the second dielectric layer 108*b*. The first plurality of corrugated shield lines 104 may help to discharge the gas that may be trapped between the first and second dielectric layers 108*a*, 108*b* due to having different surface conditions at the time of bonding, due to dishing, or other effects. The first plurality of corrugated shield lines 104 may provide a path for the gas to escape the bubbles that would otherwise form between the first and second dielectric layers 108*a*, 108*b*.

In some embodiments, such as those shown in FIG. 1A, first and second corrugated shield lines 104, 116 are symmetrical and in the first dielectric layer 108*a* and the second dielectric layer 108*b*. The first and second corrugated shield lines 104, 116 being symmetrical may result in less bubbles of gas remaining between the first and second dielectric layers 108*a*, 108*b*, as the first and second corrugated shield lines 104, 116 provide a larger path for the gas to escape while the first and second dielectric layers 108*a*, 108*b* are bonding. The first and second corrugated shield lines 104, 116 further bond together during a later process, where the enhanced bonding of the first plurality of corrugated shield lines 104 to a second corrugated shield lines 116 causes less bubbles to be present.

As shown in the cross-sectional view 200*b* of FIG. 2B, in some embodiments, a third M-M and D-D bonding layer 203 is directly beneath the first M-M and D-D bonding layer 106 and comprises a third plurality of conductive pads 204. In some embodiments, a thickness of the first M-M and D-D bonding layer 106 is greater than or equal to a thickness of the third M-M and D-D bonding layer 203. In other embodiments (not shown), a thickness of the first M-M and D-D bonding layer 106 is less than a thickness of the third M-M and D-D bonding layer 203.

The third plurality of conductive pads 204 are directly and respectively beneath the first plurality of conductive pads 102. The third plurality of conductive pads 204 are bonded respectively to the second plurality of bond contacts 112*b* at the first bond interface 105. The first corrugated shield line 104 is spaced from the first bond interface 105 by a third dielectric layer 108*c* in the third M-M and D-D bonding layer 203. In some embodiments, a bottom surface of the first corrugated shield line 104 is level with a top surface of the third M-M and D-D bonding layer 203.

The third dielectric layer 108*c* bonds more effectively to the second dielectric layer 108*b* than the first corrugated shield line 104. Therefore, because the third M-M and D-D bonding layer 203 spaces the first plurality of corrugated shield lines 104 from the first bond interface 105, a better bonding between the first IC chip 101 and the second IC chip 103 results.

Figure 2C:
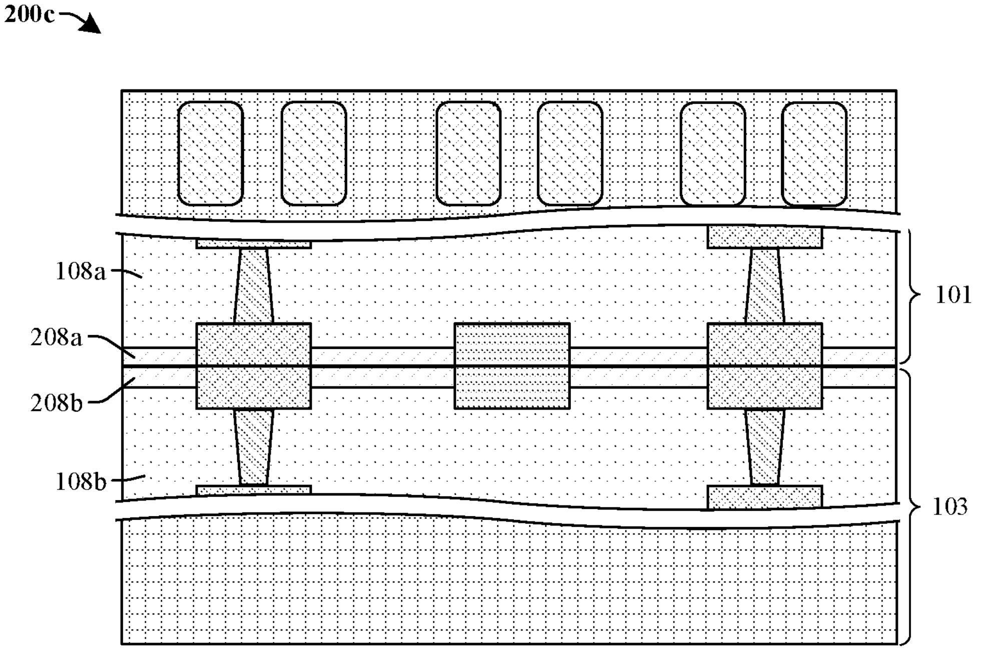
FIG. 2C illustrates a cross-sectional view of some embodiments of the IC device comprising an M-M and D-D bonding layer with corrugated shield lines with additional detail.

FIG. 2C illustrates a cross-sectional view of some embodiments of the IC device comprising an M-M and D-D bonding layer with corrugated shield lines with additional detail.

As shown in the cross-sectional view 200*c* of FIG. 2C, in some embodiments, a first dielectric material 208*a* and a second dielectric material 208*b* are present at the first bond interface 105. The first dielectric material 208*a* is part of the first dielectric layer 108*a*, and the second dielectric material 208*b* is part of the second dielectric layer 108*b*. In some embodiments, the first dielectric material 208*a* and the second dielectric material 208*b* may be or comprise one of silicon oxide (e.g., $SiO_2$), silicon nitride (e.g., $Si_3N_4$), silicon oxynitride, another insulating material, the like, or any combination of the foregoing. In further embodiments, other portions of the first dielectric layer 108*a* and the second dielectric layer 108*b* comprise dielectric materials different from the first dielectric material 208*a* and the second dielectric material 208*b*. The addition of the first dielectric material 208*a* and the second dielectric material 208*b* may result in a greater bond strength between the first IC chip 101 and the second IC chip 103.

Figure 3A:
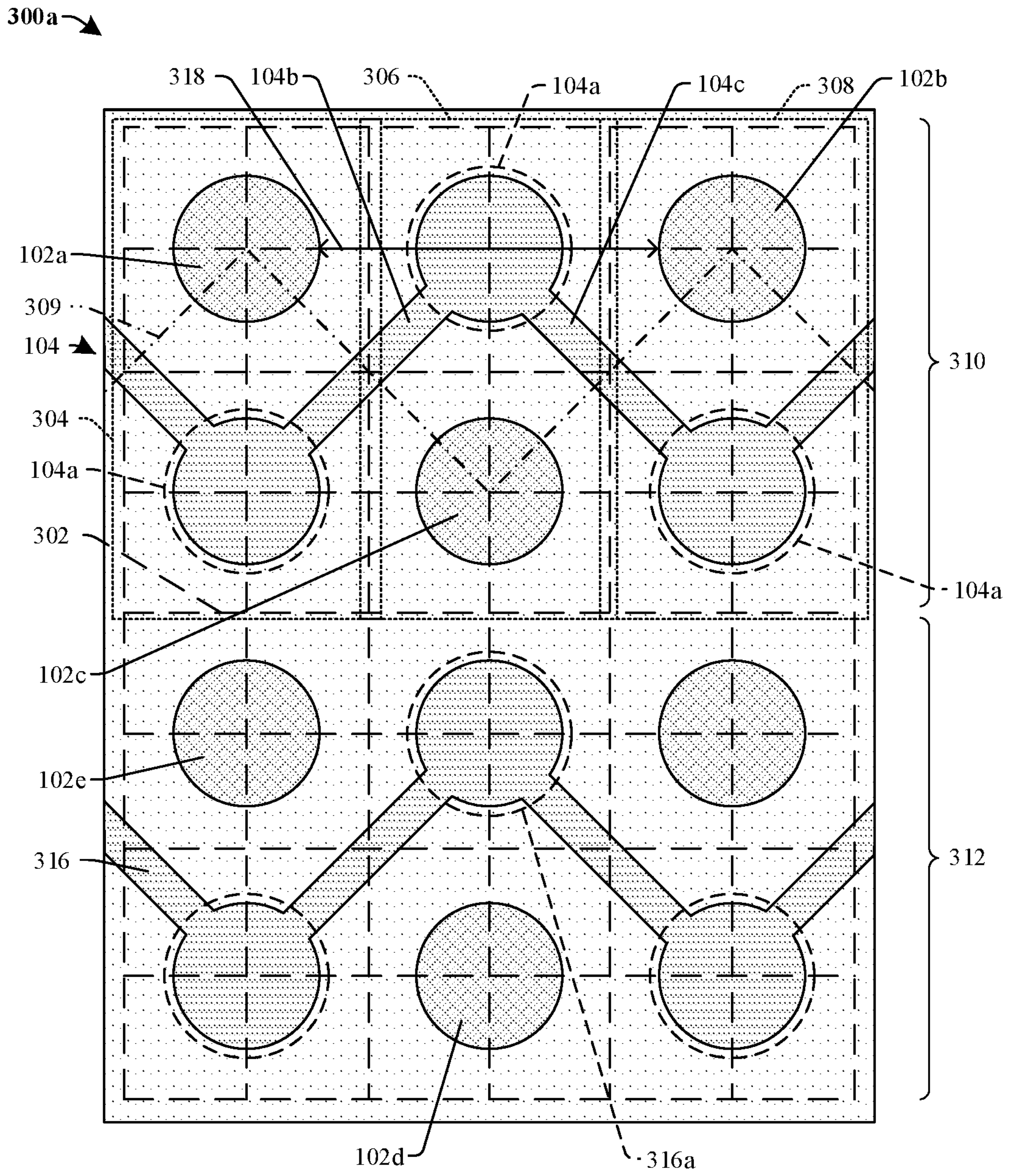
FIG. 3A illustrates a top layout view of some embodiments of the IC device comprising an M-M and D-D bonding layer with corrugated shield lines with additional detail.

FIG. 3A illustrates a top layout view of some embodiments of the IC device comprising an M-M and D-D bonding layer with corrugated shield lines with additional detail.

As shown in the top layout view 300*a* of FIG. 3A, an array of photodetectors 302 (in phantom) overlies the first plurality of conductive pads 102*a*-102*e*. The array of photodetectors 302 is such that four photodetectors are in a 2-by-2 subarray and are directly above each individual conductive pad of the first plurality of conductive pads 102 and such that four photodetectors are in a 2-by-2 subarray and are directly above each individual shield node of the shield nodes 104*a*. In some embodiments, one or more photodetectors within the array of photodetectors 302 continuously extends from directly below the first corrugated shield line 104 to laterally past an outermost sidewall of the first corrugated shield line 104.

Eight photodetectors are in a pixel block comprising a pixel. The eight photodetectors overlie and are coupled to one conductive pad and further overlie one shield node. For example, a first pixel 304 (comprising a first plurality of photodetectors) overlies and is coupled to a first conductive pad 102*a* and further overlies a shield node 104*a*. The eight photodetectors are coupled to the first conductive pad 102*a* through two floating diffusion nodes (not shown) respectively positioned directly over the first conductive pad 102*a* and the shield node 104*a*. Additional pixels 306, 308 are in a first row 310 with the first pixel 304. For example, a second pixel 306 (comprising a second plurality of photodetectors) are directly over and electrically coupled to a third conductive pad 102*c*. In some embodiments, the first plurality of photodetectors and the second plurality of photodetectors border one another. The first plurality of conductive pads 102 in the first row 310 are offset from one another in a zig-zag line 309 beneath the pixels 304, 306, 308.

In some embodiments, a first shield line segment 104*b* of the first corrugated shield line 104 is substantially normal to a part of the zig-zag line 309 extending from the first conductive pad 102*a* to a third conductive pad 102*c*, and a second shield line segment 104*c* of the first corrugated shield line 104 is substantially parallel to the part of the zig-zag line 309 extending from the first conductive pad 102*a* to the third conductive pad 102*c*. The first shield line segment 104*b* and the second shield line segment 104*c* are coupled to a shield node 104*a* that is equidistant from the first conductive pad 102*a* and the second conductive pad 102*b*, and wherein the shield node 104*a* is offset from the first conductive pad 102*a* in a first direction and offset from the second conductive pad in a second direction normal to the first direction. A part of the zig-zag line 309 extending between the third conductive pad 102*c* and a second conductive pad 102*b* is at a 45-degree angle from a line 318 extending between the second conductive pad 102*b* and the first conductive pad 102*a*. The line 318 extending between the first conductive pad 102*a* and the second conductive pad 102*b* extends through the shield node 104*a*.

In some embodiments, a second pixel 306 of the additional pixels 306, 308 overlies and is coupled to a third conductive pad 102*c* and further overlies an additional shield node 104*a* proximate to the first conductive pad 102*a* and connected to the shield node 104*a* under the first pixel 304 by the first shield line segment 104*b*. In further embodiments, the first pixel 304 and the second pixel 306 repeat periodically and alternatingly along an axis extending parallel to the first row 310 and a second row 312 and wherein shield nodes 104*a* of the repeated first and second pixels 304, 306 are electrically coupled by repeated first and second shield line segments 104*b*, 104*c* of the first corrugated shield line 104. In some embodiments, the first and second rows 310, 312 repeat periodically and alternatingly along a second axis extending perpendicular to the first and second rows 310, 312, and the first corrugated shield line 104 repeats periodically in the repeated first and second rows 310, 312.

During operation, the pixels 304, 306, 308 in the first row 310 are read in parallel, with the photodetectors in the pixels 304, 306, 308 being read row by row within the pixels. The first plurality of conductive pads 102 in other rows of pixels (e.g., the second row 312) are held at a constant voltage throughout this process, limiting the amount of interference that may come from other rows. Based on this pattern of read-out operations, the first plurality of conductive pads 102 in the first row 310 are transferring a charge to the second IC chip simultaneously (103 of FIG. 1A). The zig-zag pattern of the first plurality of conductive pads 102 increases the distance between the first plurality of conductive pads 102. As the strength of electric fields caused by the charge is inversely proportional to the square of the distance from the charge, increasing the distance lowers the strength of the electromagnetic field effects and interference caused by the charge transfer. The first corrugated shield line 104 also reduces the mutual inductance and capacitance between the first plurality of conductive pads 102 in the first row 310. The combination of the increased distance and the first corrugated shield line 104 results in a first M-M and D-D bonding layer 106 with reduced interference between the first plurality of conductive pads 102 without lowering the resolution of the pixel array.

In some embodiments, a third conductive pad 102*c* of the first plurality of conductive pads 102 is separate from a fourth conductive pad 102*d* and a fifth conductive pad 102*e*. The third conductive pad 102*c* is spaced from the fourth conductive pad 102*d* by a third corrugated shield line 316, and a line extending between the fifth conductive pad 102*e* and the third conductive pad 102*c* is parallel to a segment of the third corrugated shield line 316. In further embodiments, a first shield node 316*a* of the third corrugated shield line 316 is directly between the third conductive pad 102*c* and the fourth conductive pad 102*d*. In yet further embodiments, the third conductive pad 102*c*, the fourth conductive pad 102*d*, and the fifth conductive pad 102*e* are substantially a same distance away from the first shield node 316*a* of the third corrugated shield line 316.

Figure 3B:
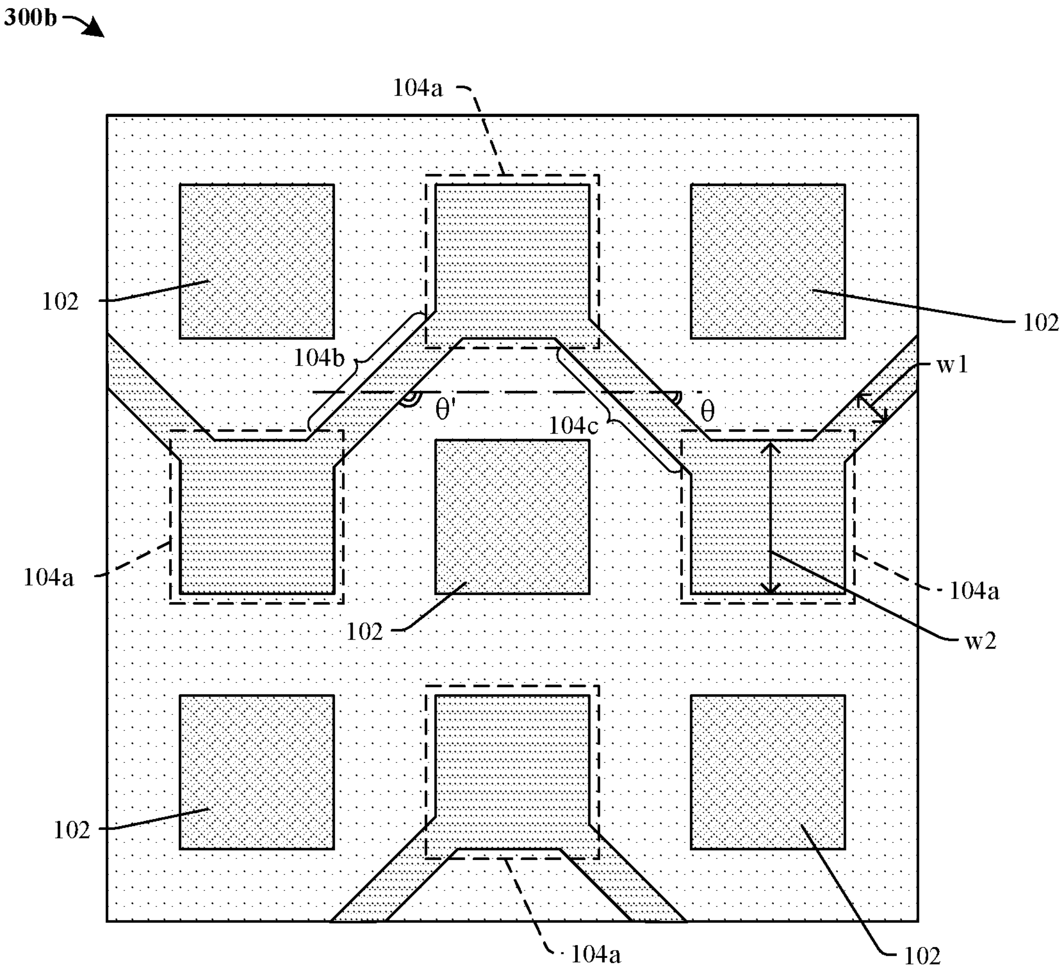
FIG. 3B illustrates a top layout view of alternative embodiments of the IC device comprising an M-M and D-D bonding layer with corrugated shield lines with additional detail.

As shown in the top layout view 300*b* of FIG. 3B, in some embodiments, the first plurality of conductive pads 102 and the shield nodes 104*a* are a square shape when viewed from a top view. The first and second shield line segments 104*b*, 104*c* connecting the shield nodes 104*a* of the first corrugated shield line 104 extend at 45 degree $\theta$ and 135 degree $\theta'$ angles to a line extending in a direction of a corresponding row. In some embodiments, the first and second shield line segments 104*b*, 104*c* may have a first width w1 between approximately 1000 and 200 angstroms, between approximately 800 and 1800 angstroms, between 1200 and 2200 angstroms, or within another suitable range. In some embodiments, the shield nodes 104*a* may have a second width w2 that is larger than the first width w1.

Figure 4:
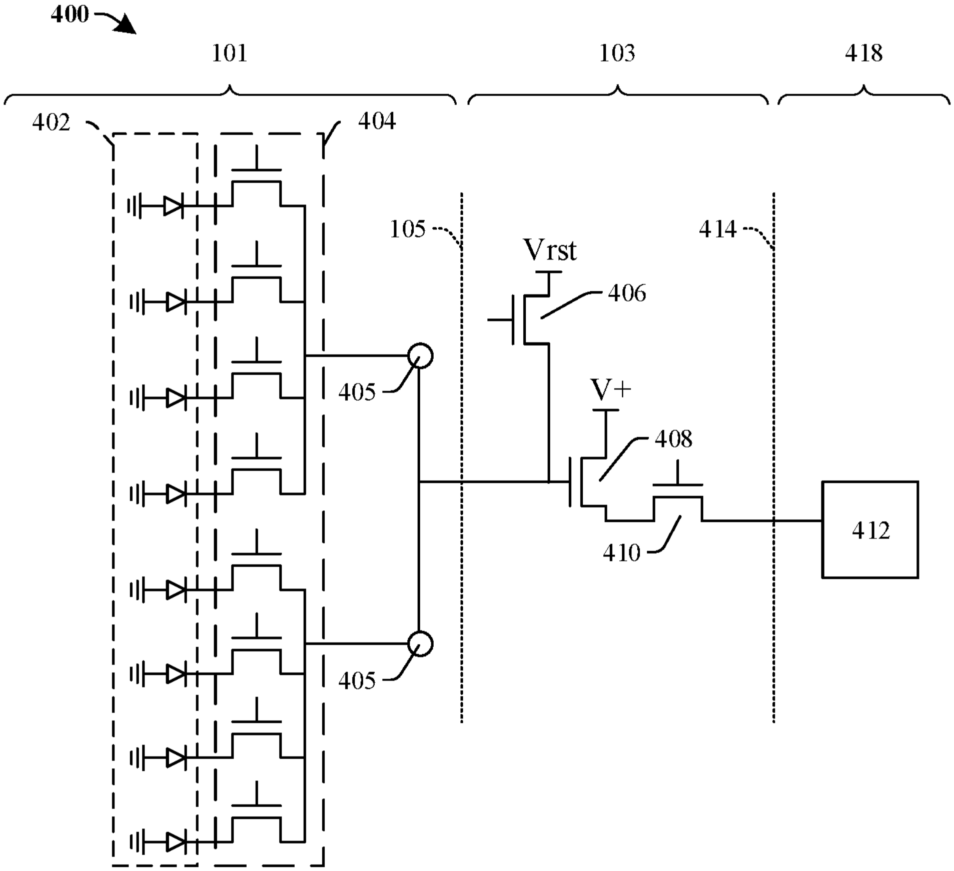
FIG. 4 illustrates a circuit diagram of some embodiments of an IC device with a 2-by-4 array of photodetectors in a first IC chip and connected to a second IC chip through a bonding interface.

FIG. 4 illustrates a circuit diagram of some embodiments of an IC device with a 2-by-4 array of photodetectors in a first IC chip and connected to a second IC chip through a bonding interface.

As shown in the circuit diagram 400 of FIG. 4, eight photodetectors 402 are electrically coupled to floating diffusion nodes 405 through eight transfer transistors 404. The floating diffusion nodes 405 in the first IC chip 101 are coupled to a source-follower transistor 408 in the second IC chip 103 through the first bond interface 105. In some embodiments, there are two floating diffusion nodes 405 per source-follower transistor 408, and the eight photodetectors 402 are evenly distributed between the two floating diffusion nodes 405. For example, the eight photodetectors 402 may be grouped into two 2-by-2 subarrays corresponding to the floating diffusion nodes 405. A reset transistor 406 selectively couples the floating diffusion nodes 405 to a reset voltage Vrst to reset the floating diffusion nodes 405 in order to perform additional measurements. The source-follower transistor 408 is coupled to a select transistor 410, which controls the transfer of a signal corresponding to the measured photocurrent of the photodetectors 402 to an application specific integrated circuit (ASIC) 412 on a third IC chip 418. The third IC chip 418 is bonded to the second IC chip 103 through a second bond interface 414.

Figure 5:
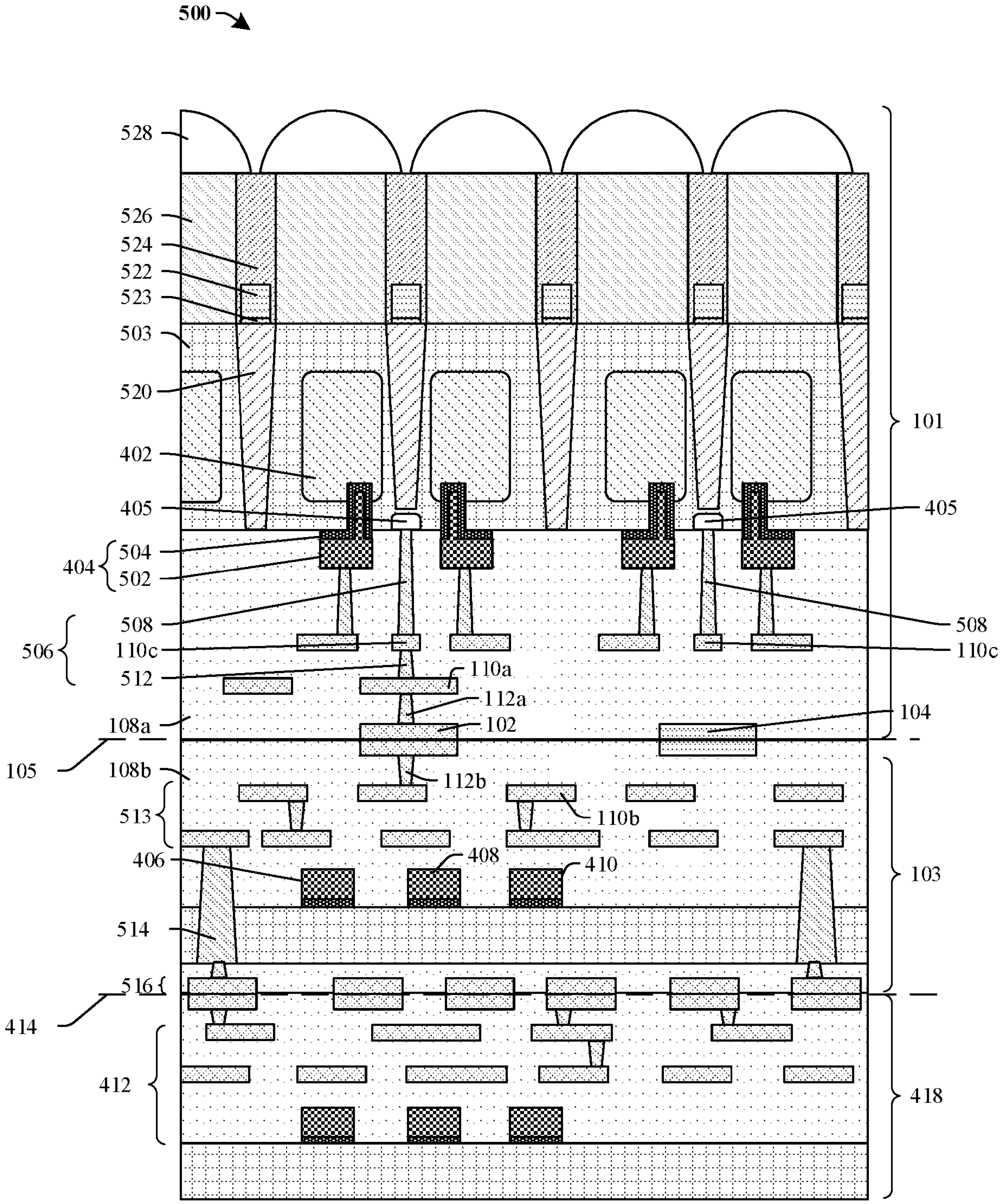
FIG. 5 illustrates a cross-sectional view of some embodiments of an IC device comprising an M-M and D-D bonding layer with corrugated shield lines at a bond interface.

FIG. 5 illustrates a cross-sectional view of some embodiments of an IC device comprising an M-M and D-D bonding layer with corrugated shield lines at a bond interface.

As shown in the cross-sectional view 500 of FIG. 5, the first IC chip 101, the second IC chip 103, and a third IC chip 418 are bonded together at a first bond interface 105 and a second bond interface 414. A pixel is illustrated, with components individual to the pixel within the first IC chip 101 and the second IC chip 103. The transfer transistors 404 couple the photodetectors 402 to the floating diffusion nodes 405. The transfer transistors 404 comprise individual gate electrodes 502 and individual gate dielectrics 504 that are stacked respectively with the gate electrodes 502 to form gate stacks. Further, the transfer transistors 404 comprise individual source/drain regions in a substrate 503. In some embodiments, the substrate 503 is or comprises one of a bulk semiconductor, a semiconductor-on-insulator (SOI) substrate, or the like, which may be doped (e.g., with a p-type or an n-type dopant) or undoped. The source/drain regions include collector regions of the photodetectors 402 and the floating diffusion nodes 405. Source/drain region(s) may refer to a source or a drain, individually or collectively dependent upon the context.

The application of a bias voltage to the gate electrodes 502 of the transfer transistors 404 forms channels between the photodetectors 402 and the floating diffusion nodes 405, providing a path for a photocurrent to flow. The photocurrent flows from the floating diffusion nodes 405 to the second IC chip 103 through a first interconnect structure 506.

The first interconnect structure 506 comprises contacts 508 extending from the floating diffusion nodes 405. The first interconnect structure 506 further comprises a plurality of wire levels 110*a*-110*c* and a plurality of vias 512 alternatingly stacked from the contact 508 to the first plurality of bond contacts 112*a* (only one of which is shown). The plurality of wire levels 110*a*-110*c* and the plurality of vias 512 are alternatingly stacked into conductive paths. The plurality of wire levels 110*a*-110*c* provide lateral routing between the plurality of vias 512. The plurality of vias 512 provide vertical routing between the plurality of wire levels 110*a*-110*c*.

In some embodiments, one or more additional wire levels are between the first wire level 110*a* and the third wire level 110*c*. In some embodiments, the contacts 508, the plurality of wire levels 110*a*-110*c*, the plurality of vias 512, or any combination of the foregoing are or comprise polysilicon, copper (e.g., Cu), titanium nitride (e.g., TiN), tungsten (e.g., W), aluminum (e.g., Al), tantalum nitride (e.g., TaN), the like, or any combination of the foregoing. In some embodiments, the first plurality of bond contacts 112*a*, and the first plurality of conductive pads 102, or any combination of the foregoing are or comprise copper (e.g., Cu), silver (e.g., Ag), gold (e.g., Au), another metal, the like, or any combination of the foregoing. The first corrugated shield line 104 is laterally spaced from the first plurality of conductive pads 102.

The second plurality of bond contacts 112*b* extend from the second plurality of conductive pads 114 to a second interconnect structure 513. Further, the second interconnect structure 513 extends from the second plurality of bond contacts 112*b* to the reset transistor 406, the source-follower transistor 408, and the select transistor 410. The second plurality of bond contacts 112*b* may, for example, be as the first plurality of bond contacts 112*a* are described. Further, the second interconnect structure 513 may, for example, be as the first interconnect structure 506 is described other than layout and/or numbers of conductive features.

The second interconnect structure 513 is electrically coupled to the ASIC 412 on the third IC chip 418 through a through-substrate via (TSV) 514. The TSV 514 is coupled to the third IC chip 418 through additional M-M and D-D bonding layers 516 at the second bond interface 414. In some embodiments, a second interconnect structure 513 may be or comprise a same material as the first interconnect structure 506. The additional M-M and D-D bonding layers 516 may, for example, be as the first M-M and D-D bonding layer 106 is described other than layout and/or numbers of conductive pads.

In some embodiments, the photodetectors 402 are separated from one another by a backside deep trench isolation (BDTI) structure 520. A backside metal grid (BSMG) 522 overlies the BDTI structure 520 and is surrounded a grid of dielectric material 524. In some embodiments, a barrier layer 523 is between the BSMG 522 and the BDTI structure 520. A plurality of color filters 526 is disposed within the grid of dielectric material 524 and overlies the photodetectors 402. In further embodiments, a plurality of micro-lenses 528 are disposed over the color filters 526. The color filters 526 and the micro-lenses 528 are arranged in a plurality of rows and a plurality of columns, respectively overlying the photodetectors 402 of the pixel array.

Although FIGS. 1A-5 are described in relation to an image sensor integrated chip, it will be appreciated that the disclosed corrugated shield line is not limited to such embodiments. Rather, the disclosed corrugated shield line may be applicable in any integrated chip structure comprising an array of conductive bond pads that are operated in a row-by-row or column-by-column manner.

FIGS. 6-12, 13A, 13B, and 14-18 illustrate a series of cross-sectional and top layout views 600-1200, 1300*a*, 1300*b*, 1400-1800 of some embodiments of a method of forming an IC device comprising an M-M and D-D bonding layer with corrugated shield lines at a bonding interface. The method may, for example, be employed to form the integrated chip of FIG. 5 or the like. Although FIGS. 6-12, 13A, 13B, and 14-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
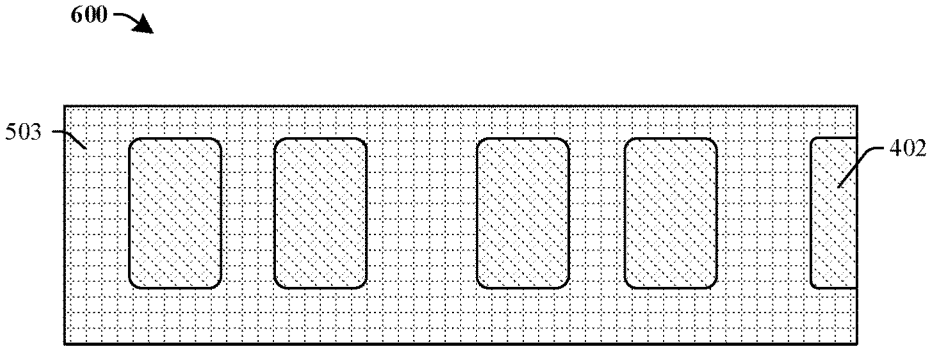
FIGS. 6-12, 13A, 13B, and 14-18 illustrate a series of cross-sectional and top layout views of some embodiments of a method for forming an IC device comprising an M-M and D-D bonding layer with corrugated shield lines at a bonding interface.

As shown in the cross-sectional view 600 of FIG. 6, the plurality of photodetectors 402 are formed in the substrate 503 of the integrated chip. In some embodiments, the photodetectors 402 are formed through an implantation process. In further embodiments, a first masking layer (not shown) is formed over the substrate 503 before the implantation process to protect portions of the substrate 503 outside of the photodetectors 402 from dopants.

Figure 7:
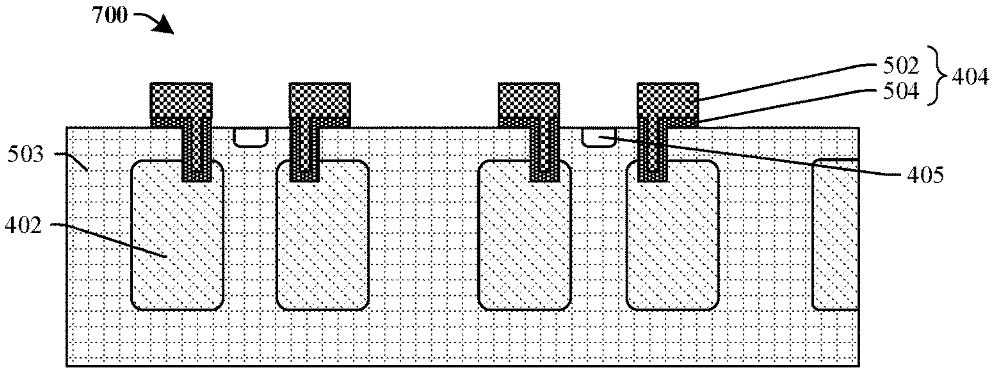

As shown in the cross-sectional view 700 of FIG. 7, a plurality of transfer transistors 404 and floating diffusion nodes 405 are formed on the substrate 503. In some embodiments, the transfer transistors 404 are formed using one or more deposition steps to form layers corresponding to the plurality of gate dielectrics 504 and the plurality of gate electrodes 502. In further embodiments, one or more etching processes are performed to pattern the layers into the plurality of gate dielectrics 504 and the plurality of gate electrodes 502. In some embodiments, the plurality of floating diffusion nodes 405 are formed through an implantation process.

Figure 8:
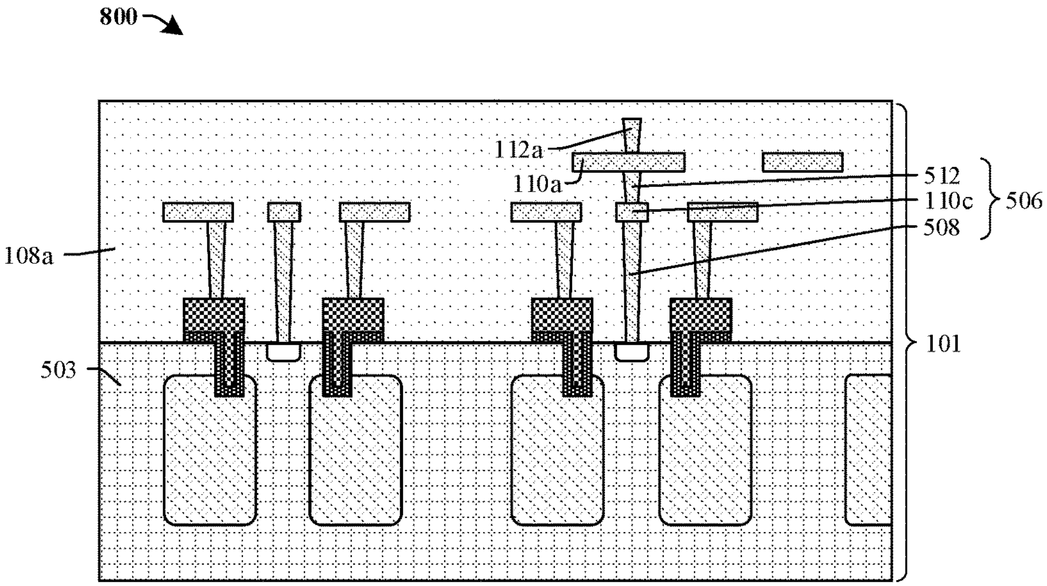

As shown in the cross-sectional view 800 of FIG. 8, the first interconnect structure 506, the first wire level 110*a*, and the first plurality of bond contacts 112*a* of the first IC chip 101 are formed in a first dielectric layer 108*a*. In some embodiments, the first interconnect structure 506, the first wire level 110*a*, and the first plurality of bond contacts 112*a* are formed by first depositing a portion of the first dielectric layer 108*a*. A mask (not shown) is formed over an uppermost surface of the first dielectric layer 108*a*, the pattern of the mask corresponding to the features of the via or wire to be formed. An etching step is then performed, removing portions of the first dielectric layer 108*a* to form openings (not shown) corresponding to the pattern of the mask. The mask is then stripped, and resulting openings are filled with a conductive material. In some embodiments, the conductive material is formed using chemical vapor deposition (CVD), physical vapor deposition (PVD), atomic layer deposition (ALD), sputtering, electrochemical plating, electroless plating, some other suitable deposition process, or a combination of the foregoing. In further embodiments, a planarization process is performed to remove excess conductive material from above the uppermost surface of the first dielectric layer 108*a*. The formation process then repeats for the remaining layers of the first interconnect structure 506, the first wire level 110*a*, and the first plurality of bond contacts 112*a*. An additional portion of the first dielectric layer 108*a* is formed over the first plurality of bond contacts 112*a*, in order to form the conductive pads of the first M-M and D-D bonding layer 106 hereafter.

Figure 9:
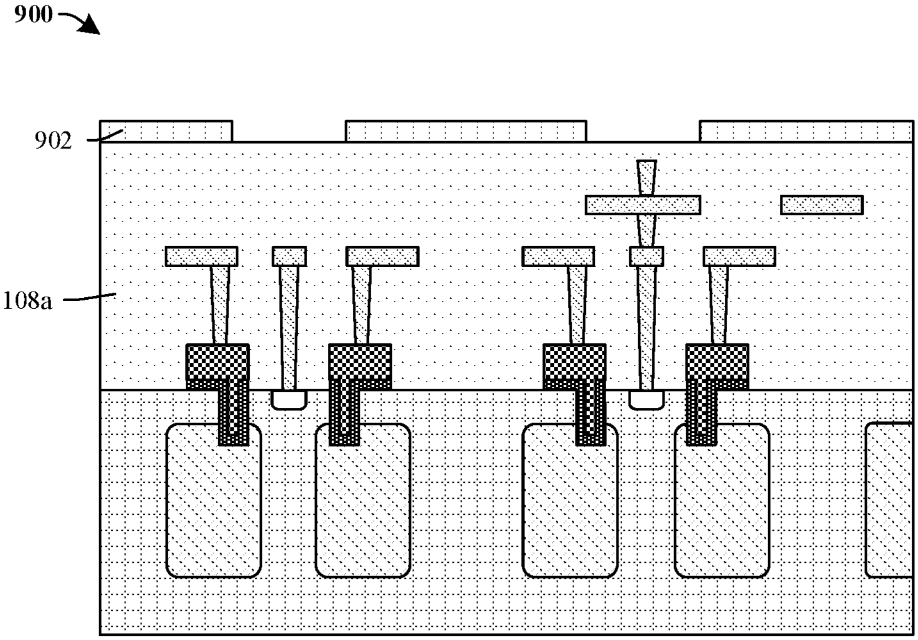

As shown in the cross-sectional view 900 of FIG. 9, a second mask 902 is formed over the first dielectric layer 108*a*. The second mask 902 has openings that correspond to the footprints (e.g., the lateral area) of both the first plurality of conductive pads 102 of the first M-M and D-D bonding layer (106 of FIG. 1A) and the first plurality of corrugated shield lines (104 of FIG. 1B). In some embodiments, the second mask 902 is or comprises silicon oxynitride and/or other suitable materials. In some embodiments, the second mask 902 is or comprises photoresist or other suitable materials, and/or is formed by photolithography or some other suitable process.

Figure 10:
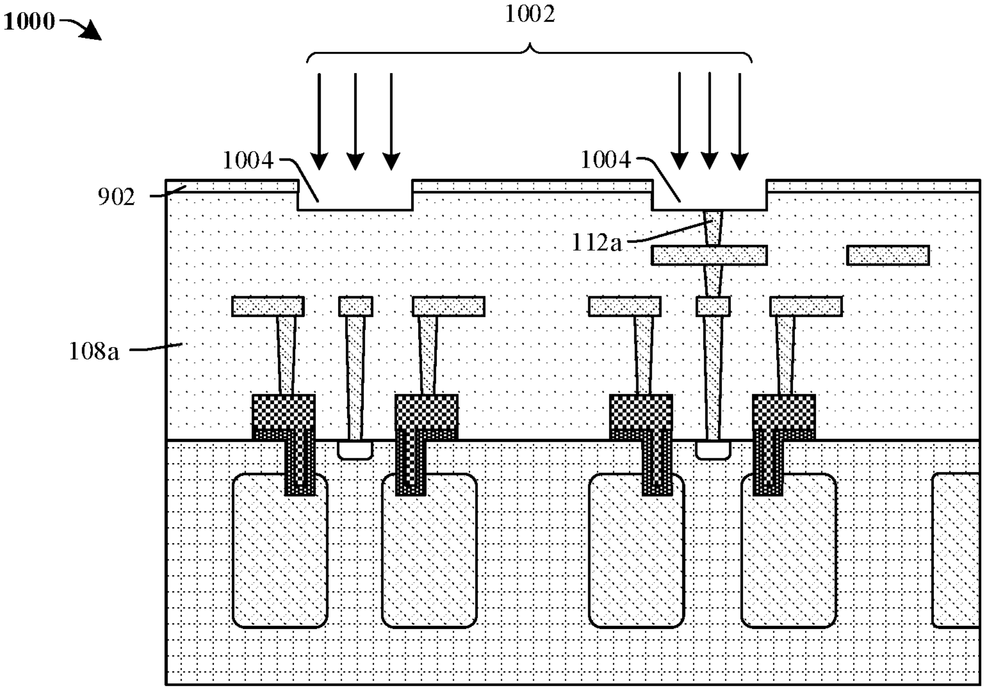

As shown in the cross-sectional view 1000 of FIG. 10, an etch 1002 is performed, removing portions of the first dielectric layer 108*a* corresponding to the openings in the second mask 902. The etch forms openings 1004 in the first dielectric layer 108*a*. The openings 1004 expose the first plurality of bond contacts 112*a* (only one of which is shown). In some embodiments, the etch 1002 is a dry etching process (e.g., plasma dry etching).

Figure 11:
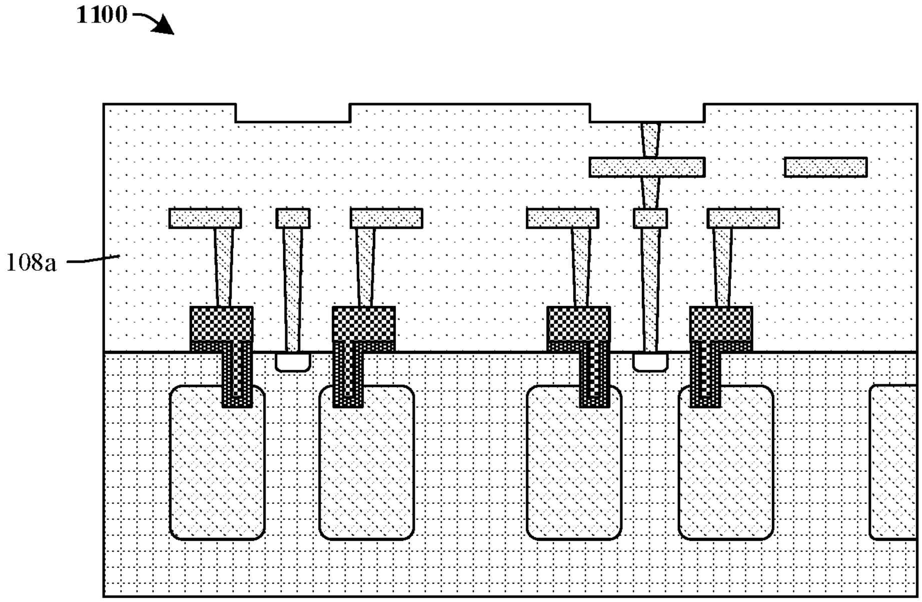

As shown in the cross-sectional view 1100 of FIG. 11, the second mask (902 of FIG. 10) is removed, exposing the uppermost surface of the first dielectric layer 108*a*. In some embodiments, the second mask (902 of FIG. 10) is removed using one or more stripping processes.

Figure 12:
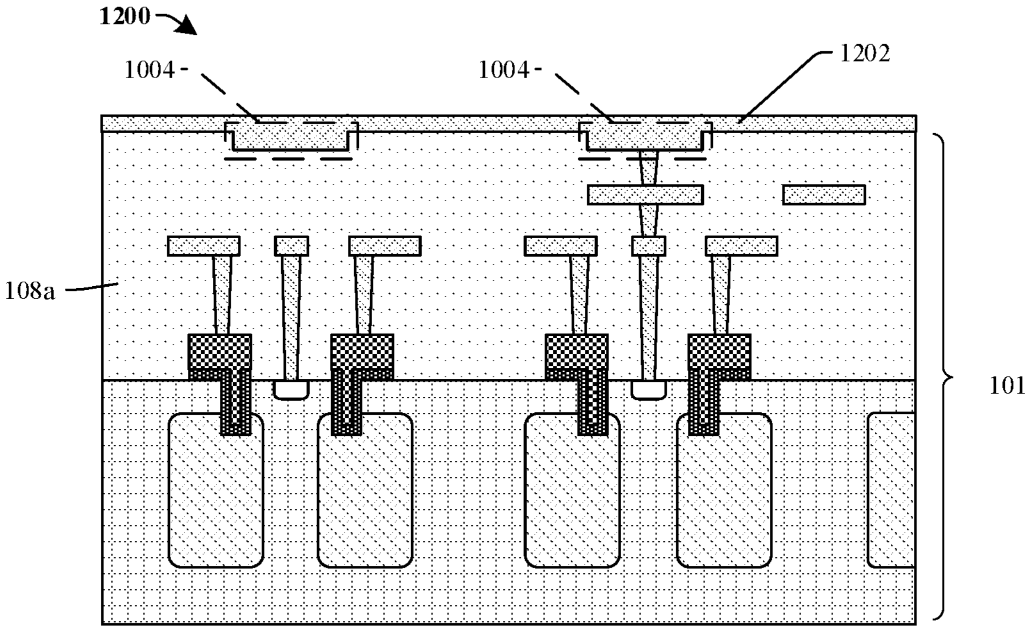

As shown in the cross-sectional view 1200 of FIG. 12, a conformal conductive layer 1202 is deposited over the uppermost surface of the first dielectric layer 108*a*. The conformal conductive layer 1202 fills the openings 1004 (shown in phantom). In some embodiments, the conformal conductive layer 1202 is deposited using chemical vapor deposition (CVD), physical vapor deposition (PVD), atomic layer deposition (ALD), some other process, or a combination of the foregoing.

Figure 13A:
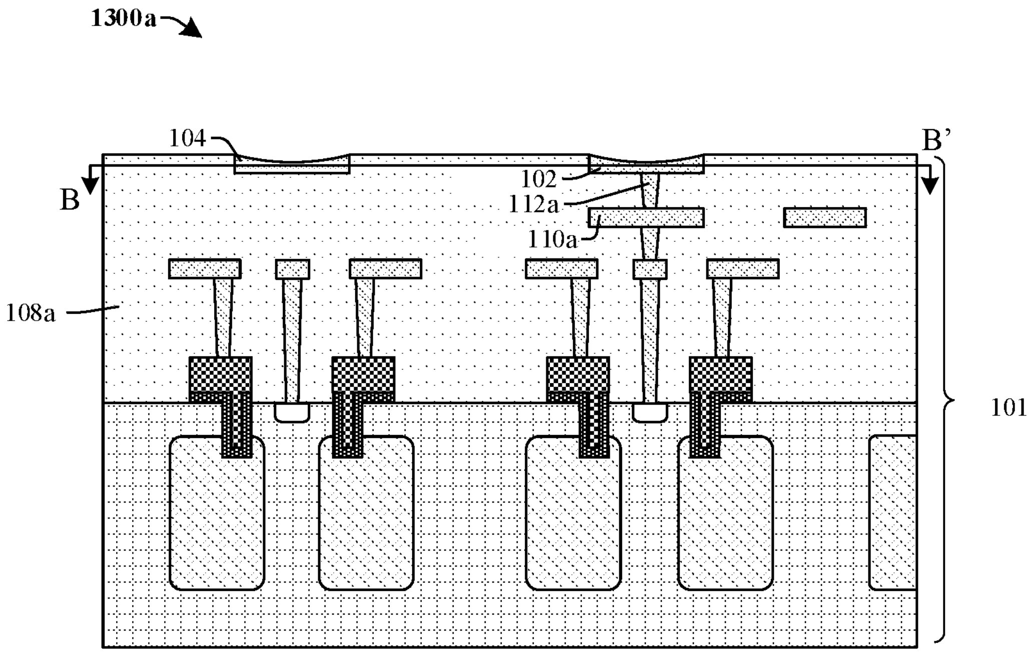
Figure 13B:
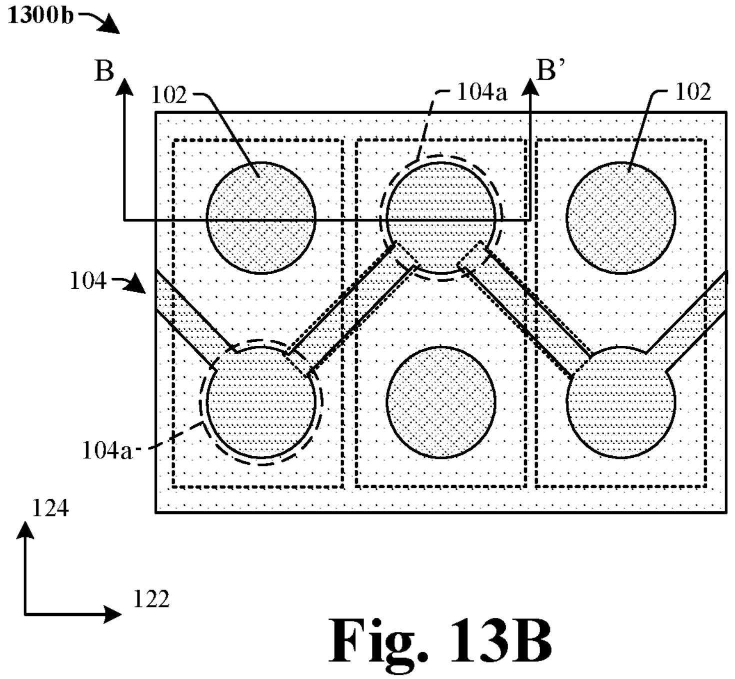

As shown in the cross-sectional and top layout views 1300*a*-1300*b* of FIGS. 13A and 13B, a planarization process (e.g., a chemical mechanical planarization (CMP) process) is performed on the conformal conductive layer (1202 of FIG. 12), removing portions of the conformal conductive layer 1202 extending above the first dielectric layer 108*a*, leaving the first plurality of conductive pads 102 and the first plurality of corrugated shield lines 104 remaining on the first dielectric layer 108*a*. The first plurality of conductive pads 102 are electrically coupled to the first wire level 110*a* by the first plurality of bond contacts 112*a*, and are electrically isolated from the first plurality of corrugated shield lines 104. In some embodiments, dishing causes upper surfaces of the first plurality of conductive pads 102 and the first plurality of corrugated shield lines 104 to be curved and extend below the uppermost surface of the first dielectric layer 108*a*. The planarization process results in the first plurality of corrugated shield lines 104 separating the first plurality of conductive pads 102, with shield nodes 104*a* being directly between individual conductive pads of the first plurality of conductive pads 102 in the first direction 122 and the second direction 124. The cross-sectional view 1300*a* of FIG. 13A may, for example, be taken along line B-B' in FIG. 13B, and/or the top layout view 1300*b* of FIG. 13B may, for example, be taken along line B-B' in FIG. 13A.

Figure 14:
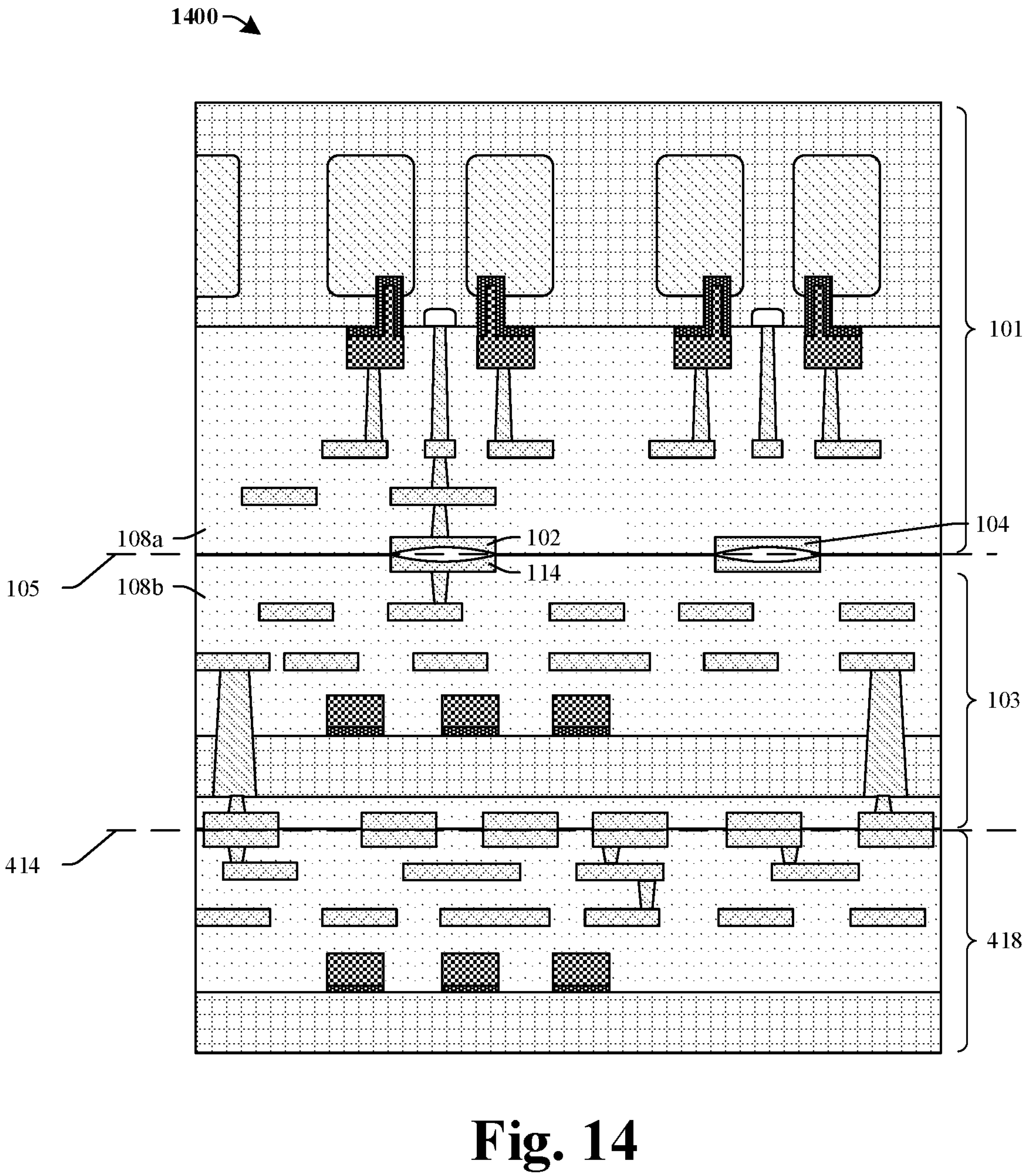

As shown in the cross-sectional view 1400 of FIG. 14, the first IC chip 101 is bonded with the second IC chip 103 and third IC chip 418. The bonding process comprises turning the first IC chip 101 over, aligning the first IC chip 101 with the second IC chip 103, then applying pressure to the center of either the first IC chip 101 or the third IC chip 418, resulting in the bonding of the first dielectric layer 108*a* to the second dielectric layer 108*b* through van der Waals forces.

Figure 15:
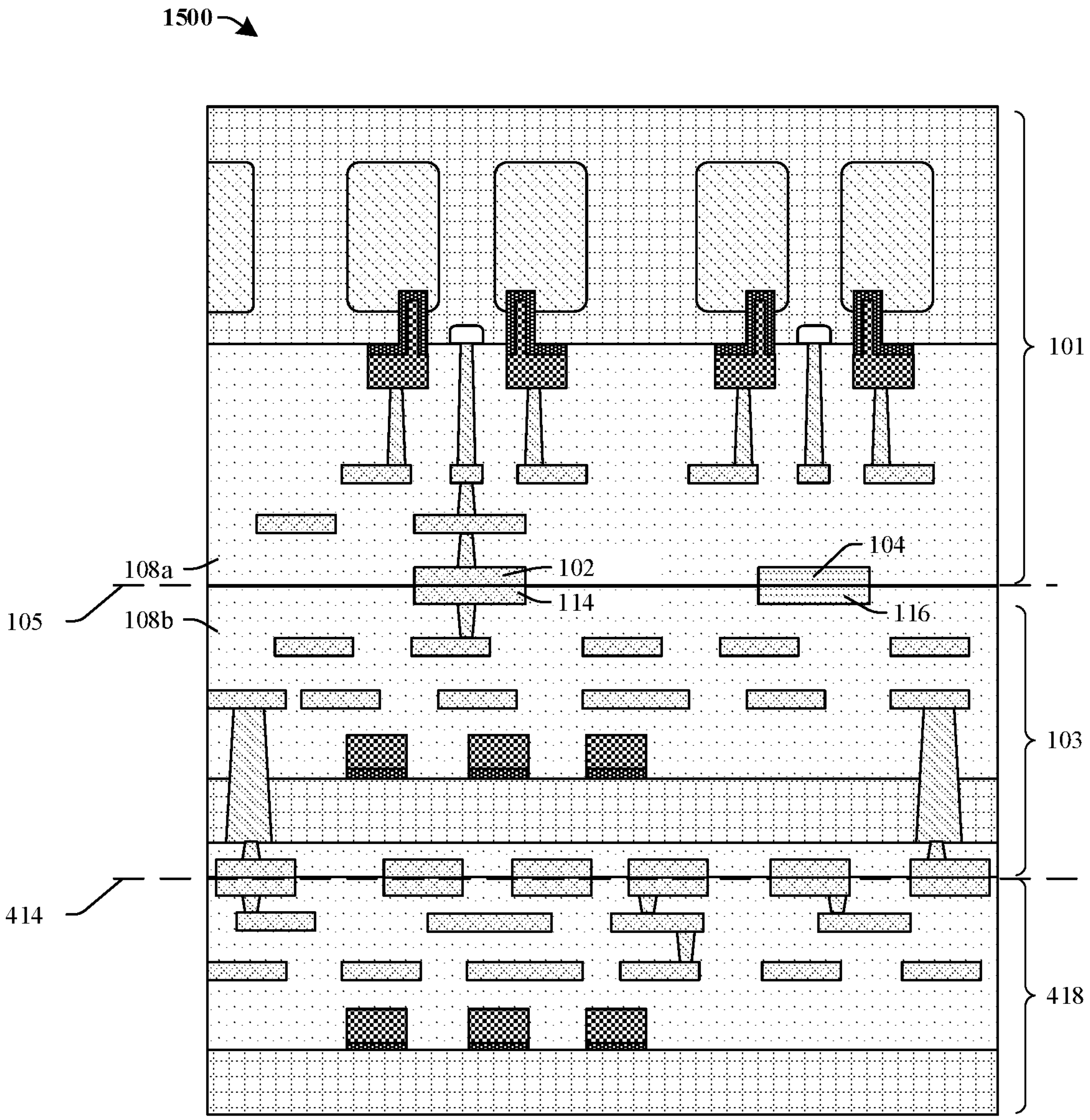

As shown in the cross-sectional view 1500 of FIG. 15, an anneal is performed, causing the first plurality of conductive pads 102 and the first plurality of corrugated shield lines 104 to expand and contact the second IC chip 103. The expansion and higher temperatures of the first plurality of conductive pads 102 results in the first plurality of conductive pads 102 bonding with the second plurality of conductive pads 114 of the second IC chip 103. The first plurality of corrugated shield lines 104 further bond with the second corrugated shield lines 116, strengthening the bond between the first IC chip 101 and second IC chip 103.

Figure 16:
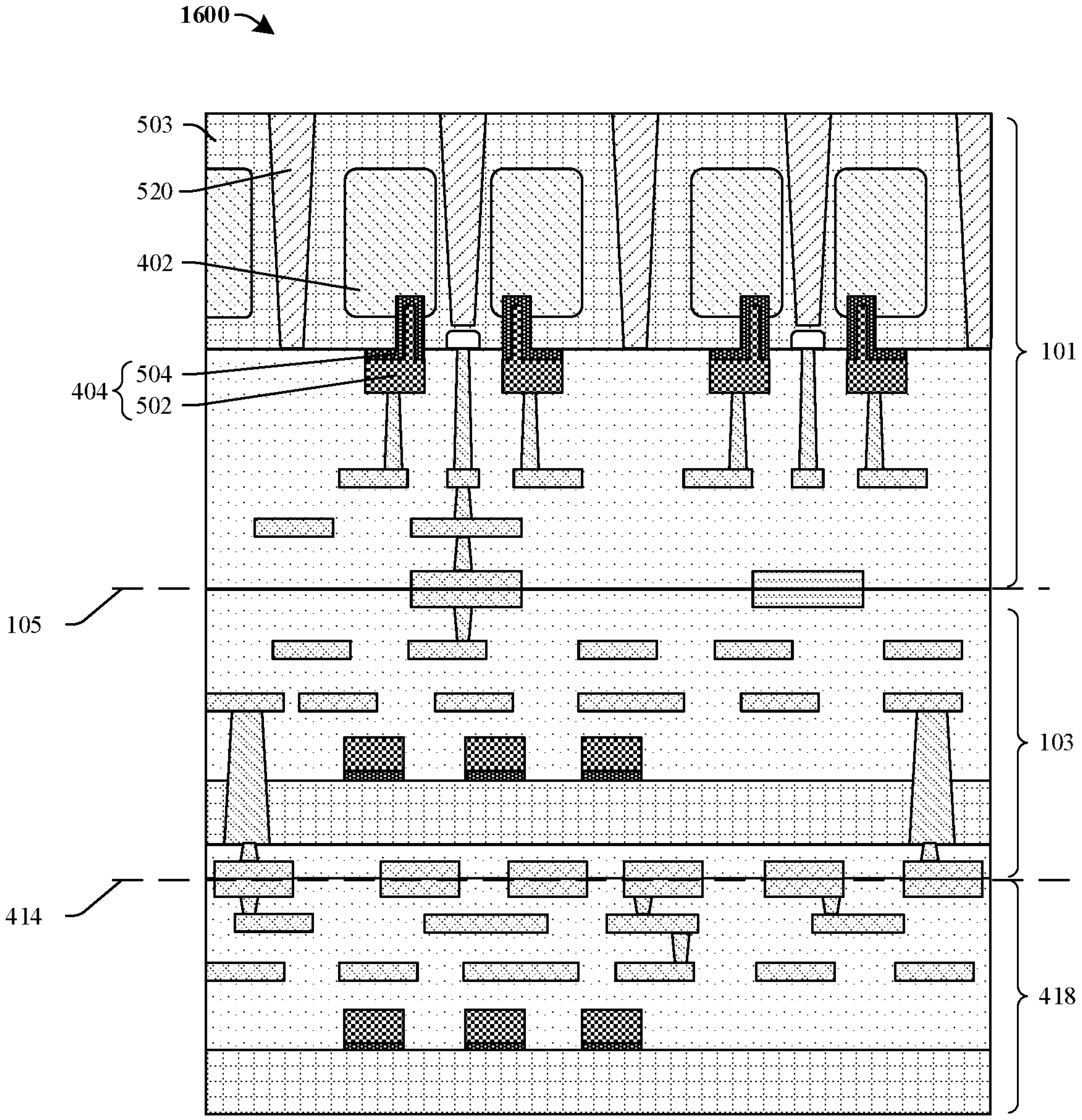

As shown in the cross-sectional view 1600 of FIG. 16, and the BDTI structure 520 is formed on a side of the substrate 503 opposite of the transfer transistors 404. The BDTI structure 520 extends into the substrate 503 and separates the photodetectors 402 from one another. The BDTI structure 520 is formed by etching one or more openings (not shown) into the substrate, and then performing one or more deposition processes to fill the openings. The BDTI structure 520 is or comprises a high-k dielectric and/or some other suitable dielectric(s).

Figure 17:
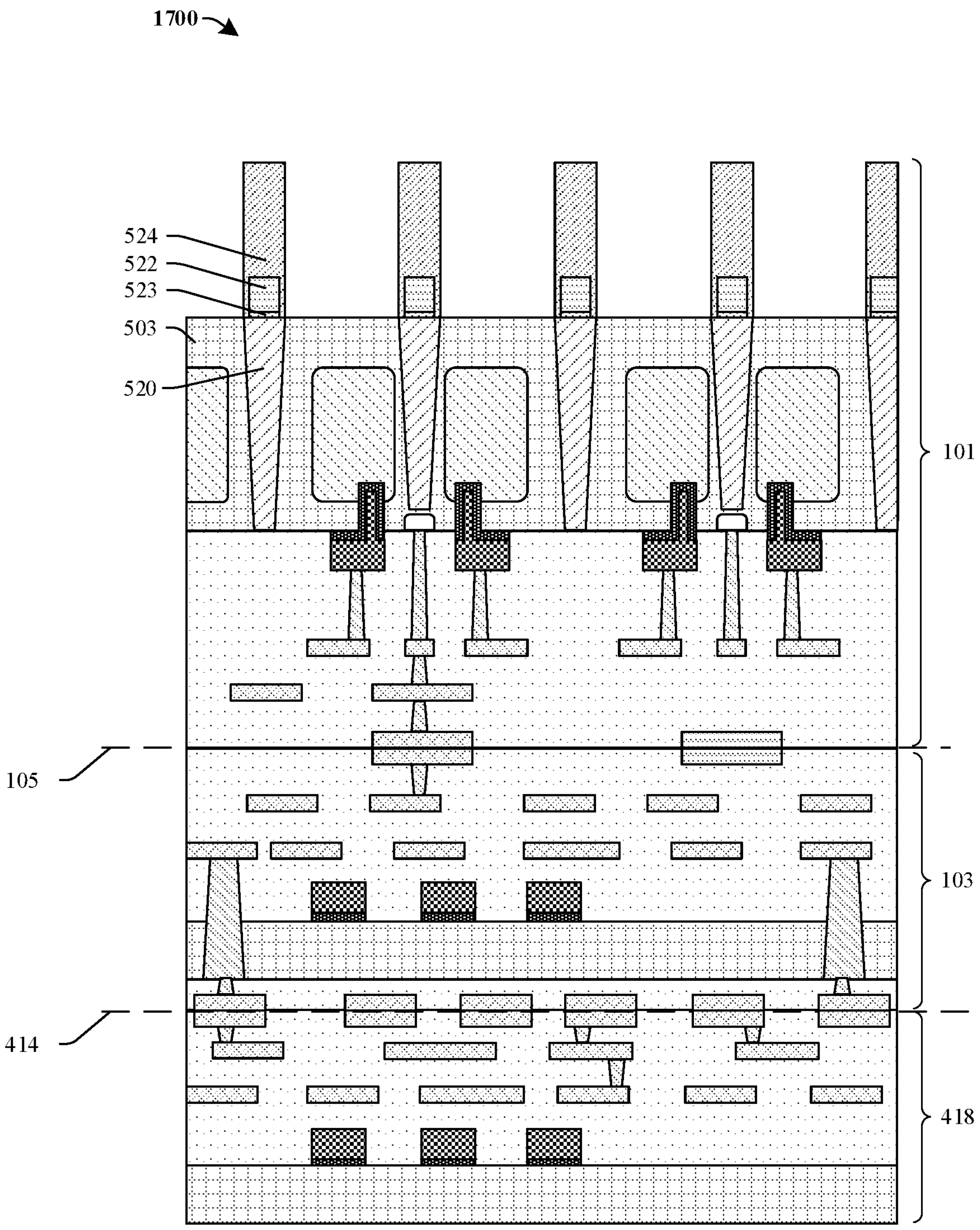

As shown in the cross-sectional view 1700 of FIG. 17, the BSMG 522 is formed over exposed surfaces of the BDTI structure 520, along with a grid of dielectric material 524. In some embodiments, a barrier layer 523 is formed between the BSMG 522 and the BDTI structure 520. The BSMG 522 and the barrier layer 523 are formed by depositing the barrier layer 523 and a metal layer (not shown) over the substrate 503, and then patterning the barrier layer 523 and the metal layer to form a grid shape. The grid of dielectric material 524 is then formed by depositing a conformal layer of dielectric material (not shown) and then patterning the conformal layer into a grid surrounding the BSMG 522.

Figure 18:
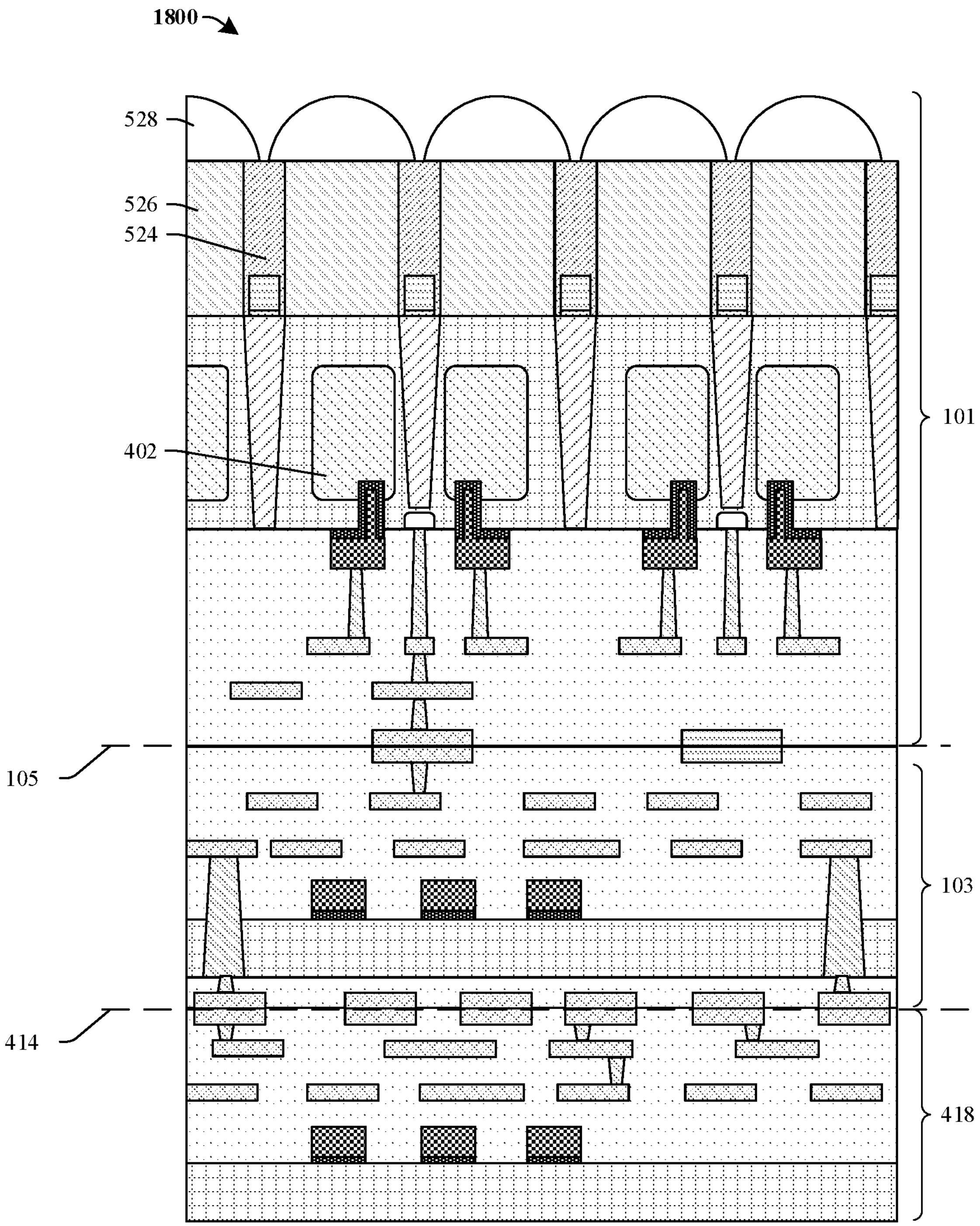

As shown in the cross-sectional view 1800 of FIG. 18, the plurality of color filters 526 is formed within the grid of dielectric material 524 and overlies the photodetectors 402. In some embodiments, the plurality of micro-lenses 528 is formed over the color filters 526.

Figure 19:
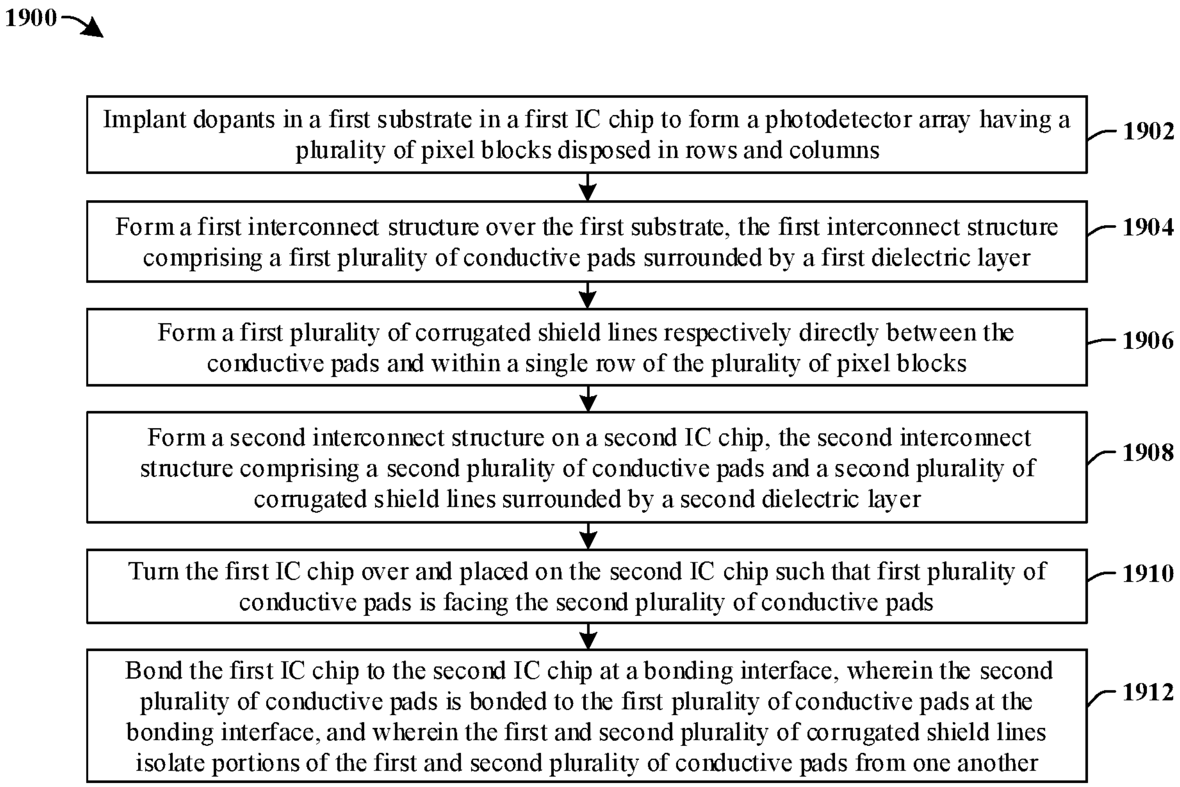
FIG. 19 illustrates a flow diagram of some embodiments of a method for forming an IC device comprising an M-M and D-D bonding layer with corrugated shield lines.

FIG. 19 illustrates a flow diagram 1900 of some embodiments of a method for forming an IC device comprising an M-M and D-D bonding layer with corrugated shield lines.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1902, dopants are implanted in a first substrate in a first IC chip to form a photodetector array having a plurality of pixel blocks disposed in rows and columns. See, for example, FIG. 6.

At 1904, a first interconnect structure is formed over the first substrate, the first interconnect structure comprising a first plurality of conductive pads surrounded by a first dielectric layer. See, for example, FIGS. 8-13.

At 1906, a first plurality of corrugated shield lines are respectively formed directly between the conductive pads and within a single row of the plurality of pixel blocks._See, for example, FIG. 13.

At 1908, a second interconnect structure is formed on a second IC chip, the second interconnect structure comprising a second plurality of conductive pads and a second plurality of corrugated shield lines surrounded by a second dielectric layer. See, for example, FIG. 14.

At 1910, the first IC chip is turned over and placed on the second chip such that first plurality of conductive pads is facing the second plurality of conductive pads. See, for example, FIG. 14.

At 1912, the first IC chip is bonded to the second IC chip at a bonding interface, wherein the second plurality of conductive pads is bonded to the first plurality of conductive pads at the bonding interface, and wherein the first and second plurality of corrugated shield lines isolate portions of the first and second plurality of conductive pads from one another. See, for example, FIGS. 14-15.

Therefore, the present disclosure relates to a method of forming an IC device comprising an M-M and D-D bonding layer with corrugated shield lines.

Some embodiments relate to an IC device, including a first IC chip comprising a plurality of pixel blocks respectively including one of a first plurality of conductive pads recessed into a first dielectric layer, the plurality of pixel blocks arranged in rows extending in a first direction and columns extending in a second direction perpendicular to the first direction; a second IC chip bonded to the first IC chip at a bonding interface, where the second IC chip comprises a second plurality of conductive pad recessed into a second dielectric layer and contacting the first plurality of conductive pads along the bonding interface; and a first corrugated shield line having outermost edges set-back along the second direction from outermost edges of a first row of the plurality of pixel blocks, the first corrugated shield line being arranged within the first dielectric layer and laterally separating neighboring ones of the first plurality of conductive pads within the first row of the plurality of pixel blocks.

In other embodiments, the present disclosure relates to an IC device, including a first IC chip; a second IC chip bonded to the first IC chip at a bonding interface; and a first pixel arranged across the first IC chip and the second IC chip and comprising a first photodetector subarray and a second photodetector subarray, wherein the first and second IC chips respectively comprise a first dielectric layer and a second dielectric layer directly contacting at the bonding interface, the first IC chip further comprises a first conductive pad and a first shield node recessed into the first dielectric layer and at the bond interface, the first conductive pad underlies the first photodetector subarray, the first shield node underlies the second photodetector subarray, and a first segment and a second segment of a first corrugated shield line protrude outward from opposing sidewalls of the first shield node to partially surround the first conductive pad.

In yet other embodiments, the present disclosure relates to a method of forming an integrated circuit (IC) device including implanting dopants in a first substrate in a first IC chip to form a photodetector array; forming a first interconnect structure over the first substrate, the first interconnect structure comprising a first plurality of conductive pads surrounded by a first dielectric layer; forming a first plurality of corrugated shield lines directly between the conductive pads; forming a second interconnect structure on a second IC chip, the second interconnect structure comprising a second plurality of conductive pads and a second plurality of corrugated shield lines surrounded by a second dielectric layer; turning the first IC chip over and placing the first IC chip on the second IC chip such that first plurality of conductive pads is facing the second plurality of conductive pads; and bonding the first IC chip to the second IC chip at a bonding interface, wherein the second plurality of conductive pads is bonded to the first plurality of conductive pads at the bonding interface, and wherein the first and second plurality of corrugated shield lines isolate portions of the first and second plurality of conductive pads from one another.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) device, comprising:

implanting dopants in a first substrate in a first IC chip to form a photodetector array having a plurality of pixel blocks disposed in rows and columns;

forming a first interconnect structure over the first substrate, the first interconnect structure comprising a first plurality of conductive pads surrounded by a first dielectric layer;

forming a first plurality of corrugated shield lines directly between the conductive pads and respectively within single rows of the plurality of pixel blocks, wherein from a top-down perspective level with the conductive pads, the first plurality of corrugated shield lines are isolated from one another in a first direction, extend in a second direction perpendicular to the first direction, and comprise conductive shield line segments extending in directions different from the first direction and the second direction;

forming a second interconnect structure on a second IC chip, the second interconnect structure comprising a second plurality of conductive pads and a second plurality of corrugated shield lines surrounded by a second dielectric layer;

turning the first IC chip over and placing the first IC chip on the second IC chip such that the first plurality of conductive pads is facing the second plurality of conductive pads; and bonding the first IC chip to the second IC chip at a bonding interface, wherein the second plurality of conductive pads is bonded to the first plurality of conductive pads at the bonding interface, and wherein the first and second pluralities of corrugated shield lines isolate portions of the first and second plurality of conductive pads from one another.

2. The method of claim 1, wherein the first dielectric layer is bonded to the second dielectric layer with van der Waals forces, and wherein the bonding of the first IC chip to the second IC chip further comprises performing an anneal to bond the second plurality of conductive pads to the first plurality of conductive pads.

3. The method of claim 1, wherein eight photodetectors of the photodetector array are electrically coupled to one conductive pad, wherein the eight photodetectors are within two 2-by-2 photodetector subarrays respectively coupled to a first floating diffusion node and a second floating diffusion node, and wherein the first and second floating diffusion nodes are directly above the one conductive pad and directly above a corrugated shield line of the first plurality of corrugated shield lines, respectively.

4. The method of claim 1, wherein the first plurality of corrugated shield lines is formed concurrently with the first plurality of conductive pads.

5. A method of forming an integrated device, comprising:

forming a first interconnect structure over a first substrate, the first interconnect structure comprising a first plurality of conductive contacts in a first dielectric layer and spaced from each other in a first direction;

forming a first corrugated shield line concurrently with forming the first plurality of conductive contacts, the first corrugated shield line having a first shield node between and in a line with a first conductive pad and a second conductive pad of the first plurality of conductive contacts in the first direction, second shield nodes in lines with the first conductive pad and the second conductive pad in a second direction perpendicular to the first direction and in a line with a third conductive pad in the first direction, and shield line segments extending between the first shield node and the second shield nodes, wherein the forming of the first plurality of conductive contacts and the first corrugated shield line results in the first plurality of conductive contacts and the first and second shield nodes having curved upper surfaces that extend beneath an upper surface of the first dielectric layer;

forming a second interconnect structure on a second substrate, the second interconnect structure comprising a second plurality of conductive contacts in a second dielectric layer; and bonding the second plurality of conductive contacts to the first plurality of conductive contacts at a bonding interface.

6. The method of claim 5, wherein forming the first plurality of conductive contacts and the first corrugated shield line further comprises:

forming and patterning a masking layer over the first dielectric layer, wherein the masking layer is patterned to have openings corresponding to top-down profiles of the first plurality of conductive contacts and the first corrugated shield line to be formed;

etching portions of the first dielectric layer exposed by the openings in the masking layer;

removing the masking layer;

forming a conformal conductive layer over the first dielectric layer, filling the openings; and removing portions of the conformal conductive layer overlying the first dielectric layer, resulting in the first plurality of conductive contacts and the first corrugated shield line remaining in the openings.

7. The method of claim 5, further comprising forming a second corrugated shield line in the second dielectric concurrently with forming the second plurality of conductive contacts, wherein the first corrugated shield line and the second corrugated shield line are bonded at the bonding interface concurrently with the bonding of the first plurality and the second plurality of conductive contacts.

8. The method of claim 5, wherein a line drawn at a 45 degree angle from the first direction on the first conductive pad also extends onto the second conductive pad.

9. The method of claim 8, wherein the line drawn at the 45 degree angle extending on the first conductive pad and the second conductive pad also extends across a shield line segment extending between the first shield node and one of the second shield nodes.

10. The method of claim 8, wherein the first shield node is spaced from the second shield nodes in the first direction and in the second direction.

11. A method of forming an integrated device, comprising:

implanting dopants in a first substrate to form a photodetector array having a plurality of pixel blocks disposed in a row extending in a first direction;

forming a first interconnect structure over the first substrate, the first interconnect structure comprising a first plurality of conductive pads surrounded by a first dielectric layer, wherein a first portion of the first plurality of conductive pads are in a first line extending in the first direction, and wherein a second portion of the first plurality of conductive pads are in a second line extending in the first direction that is spaced from the first line in a second direction perpendicular to the first direction; and forming a first shield line having first shield nodes in the first line between conductive pads of the first portion, second shield nodes in the second line between conductive pads of the second portion, and shield segments electrically coupling the first shield nodes and the second shield nodes to form a continuous structure extending between the first portion of the first plurality of conductive pads and the second portion of the first plurality of conductive pads.

12. The method of claim 11, wherein the first shield line and the first plurality of conductive pads are formed concurrently.

13. The method of claim 11, wherein pixel blocks of the row alternate between being coupled to a conductive pad of the first portion of the plurality of conductive pads in the first line and being coupled to a conductive pad of the second portion of the plurality of conductive pads in the second line.

14. The method of claim 11, wherein first shield nodes of the first line are coupled by the shield segments to the second shield nodes in the second line, and wherein shield nodes of the first line are separated in the first direction and in the second direction from shield nodes of the second line.

15. The method of claim 11, wherein a first conductive pad is closer to three shield nodes of the first shield line than other conductive pads of the plurality of conductive pads.

16. The method of claim 11, further comprising implanting dopants into the first substrate to form a floating diffusion region coupled to more than one photodetector of the photodetector array before forming the first interconnect structure, wherein after forming the first plurality of conductive pads, the floating diffusion region is coupled to a conductive pad of the first plurality of conductive pads.

17. The method of claim 11, further comprising:

forming a second interconnect structure on a second substrate and comprising a second plurality of conductive pads surrounded by a second dielectric layer; and bonding the first plurality of conductive pads to the second plurality of conductive pads.

18. The method of claim 17, further comprising:

forming a second shield line concurrently with forming the second plurality of conductive pads; and bonding the second shield line to the first shield line concurrently with bonding the first plurality of conductive pads to the second plurality of conductive pads.

19. The method of claim 11, further comprising:

forming a second interconnect structure on a second substrate and comprising a plurality of contacts surrounded by a second dielectric layer; and bonding the plurality of contacts to the first plurality of conductive pads.

20. The method of claim 11, further comprising:

forming a second shield line concurrently with the first shield line and isolated from the first shield line in the second direction by the first dielectric.

* * * * *